(12) United States Patent
Desai et al.

(10) Patent No.: US 7,260,762 B2
(45) Date of Patent: Aug. 21, 2007

(54) DECODER PERFORMANCE FOR BLOCK PRODUCT CODES

(75) Inventors: Vipul A. Desai, Palatine, IL (US); Yufei W. Blankenship, Streamwood, IL (US); Brian K. Classon, Palatine, IL (US)

(73) Assignee: Motorola, Inc., Schaumburg, IL (US)

( * ) Notice: Subject to any disclaimer, the term of this patent is extended or adjusted under 35 U.S.C. 154(b) by 427 days.

(21) Appl. No.: 10/899,337

(22) Filed: Jul. 26, 2004

(65) Prior Publication Data

US 2006/0020874 A1   Jan. 26, 2006

(51) Int. Cl.
*H03M 13/03* (2006.01)
(52) U.S. Cl. ........................... 714/755; 714/786
(58) Field of Classification Search ............ 714/786, 714/755
See application file for complete search history.

(56) References Cited

U.S. PATENT DOCUMENTS

| | | | |
|---|---|---|---|
| 5,563,897 A | 10/1996 | Pyndiah et al. | |
| 5,930,272 A | 7/1999 | Thesling | |
| 6,065,147 A | 5/2000 | Pyndiah et al. | |
| 6,122,763 A | 9/2000 | Pyndiah et al. | |
| 6,460,160 B1 * | 10/2002 | Classon | 714/791 |
| 2001/0050622 A1 | 12/2001 | Hewitt et al. | |
| 2002/0026615 A1 | 2/2002 | Hewitt et al. | |

FOREIGN PATENT DOCUMENTS

WO   WO 0019616 A3   4/2000

OTHER PUBLICATIONS

Argon et al., An efficient Chase decoder for Turbo product codes, Jun. 6, 2004, IEEE Trans. on Comm. vol. 52, No. 6, p. 896-898.*
Arico et al. Limited trial Chase Decoding, Nov. 2003, IEEE Trans. on Info. THeory, vol. 49, No. 11, p. 2972-2975.*
Chen et al. A very low complexity block turbo decoder composed of extended Hamming codes, 2001, IEEE, p. 171-175.*
Pyndiah et al., A very low complexity block turbo decoder for product codes, 1996, IEEE, p. 101-105.*
Chase, David. "A Class of Algorithms for Decoding Block Codes with Channel Measurement Information." IEEE Transactions on Information Theory, Jan. 1972, pp. 170-182, vol. IT-18, No. 1.

(Continued)

*Primary Examiner*—Shelly Chase

(57) ABSTRACT

A method of improving block turbo decoder performance that comprises receiving soft input information corresponding to a first set of constituent codes of a block product code, scaling soft extrinsic information from a second set of constituent codes of the block product code, processing the scaled soft extrinsic information and the soft input information to produce soft output information suitable for a soft-input soft-output decoder, and performing one or more of: modifying encoded bit positions of the block product code, modifying decoded bit positions of a the block product code, permuting decoding parameters of the block product code to effect a preferred decoding order, detecting cases where a number of test patterns is insufficient to decode the soft output information and thereafter providing a different number of test patterns suitable for decoding the soft output information, and adapting the number of test patterns in the soft-input soft-output decoder.

21 Claims, 12 Drawing Sheets

OTHER PUBLICATIONS

Elias, Peter. "Error-Free Coding". Department of Electrical Engineering and Research Laboratory of Electronics, Massachusetts Institute of Technology, Cambridge, Massachusetts, pp. 29-37.

Hagenauer, Joachim. "Iterative Decoding of Binary Block and Convolutional Codes". IEEE Transactions on Information Theory, Mar. 1996, pp. 429-445, vol. 42, No. 2.

IEEE Transactions on Information Theory, Mar. 1974, pp. 284-287.

Kaneko, Toshimitsu, et al. "An Improvement of Soft-Decision Maximum-Likelihood Decoding Algorithm Using Hard-Decision Bounded-Distance Decoding". IEEE Transactions on Information Theory, Jul. 1997, pp. 1314-1319, vol. 43, No. 4.

Pyndiah, Ramesh Mahendra. "Near-Optimum Decoding of Product Codes: Block Turbo Codes". IEEE Transactions on Communications, Aug. 1998, pp. 1003-1010, vol. 46, No. 8.

"TIA Standard". Telecommunications Industry Association, Mar. 11, 2003, pp. 1-49, WAI SAM CHC Specification, TIA-902.BAAD.

Gazelle, David et al. "Reliability-Based Code-Search Algorithms for Maximum-Likelihood Decoding of Block Codes". *IEEE Transactions on Information Theory*, Jan. 1997, pp. 239-249, vol. 43, No. 1.

\* cited by examiner

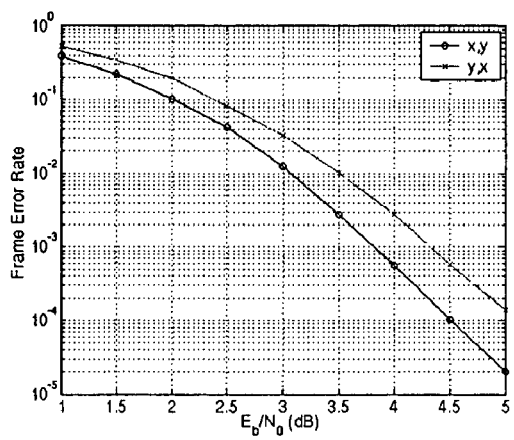
FIG. 4
FIG. 5
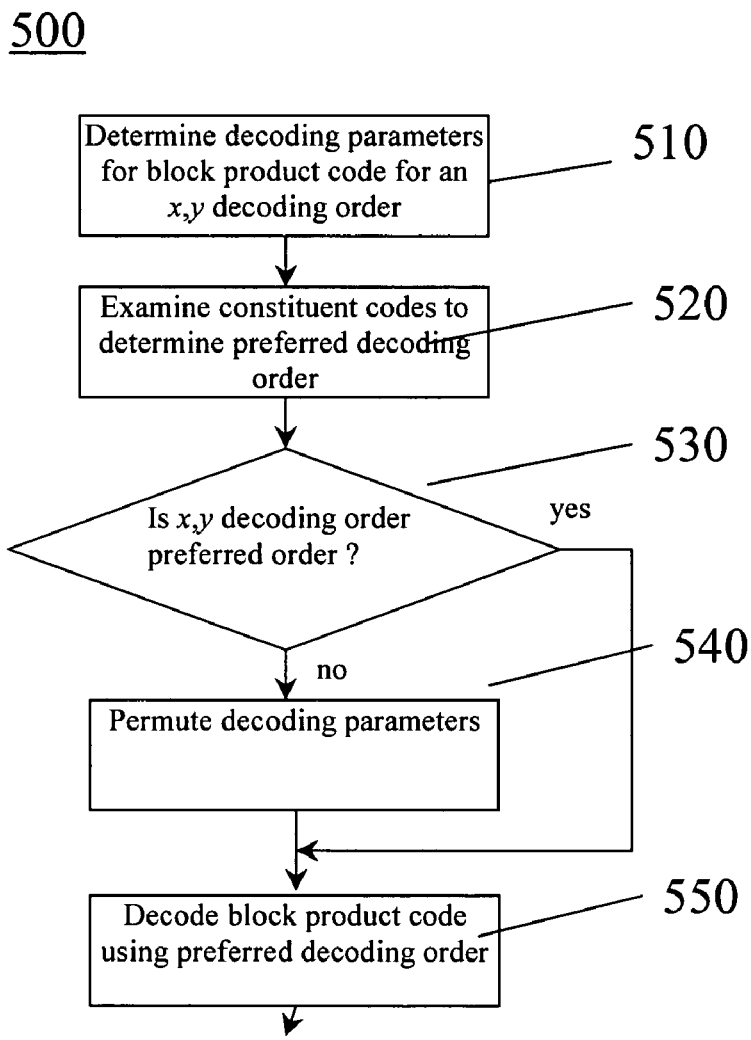

1100

1300    1310    FIG. 13    1320
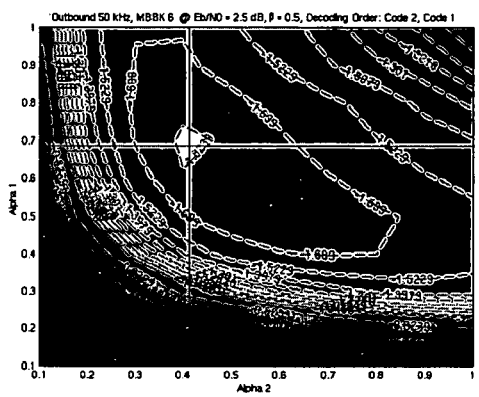
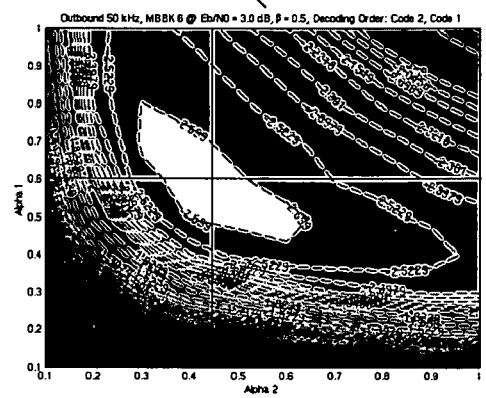
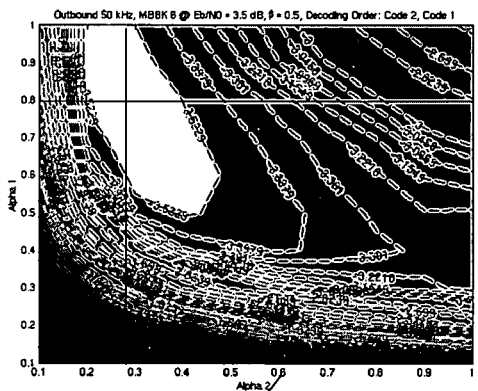
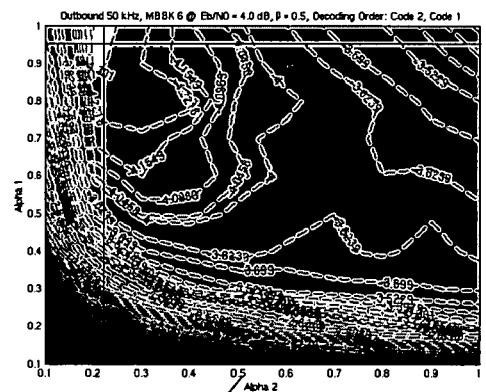
1330    1340

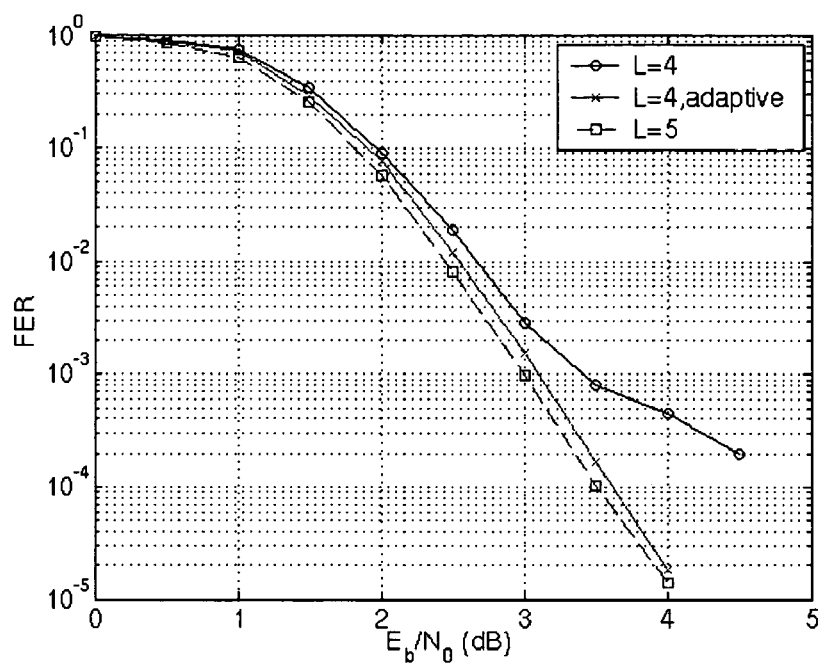
FIG. 17
FIG. 18
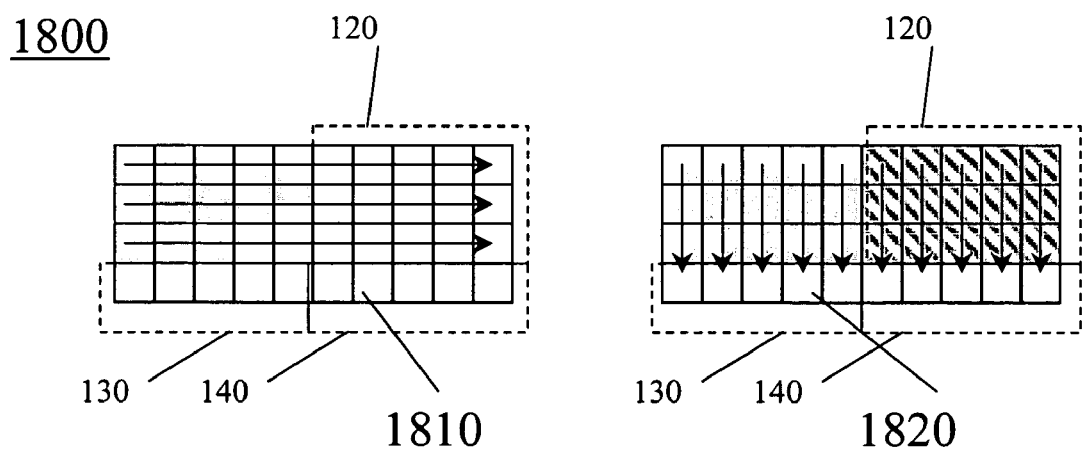

FIG. 19
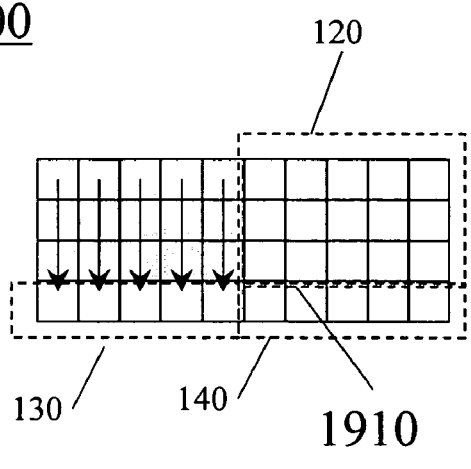
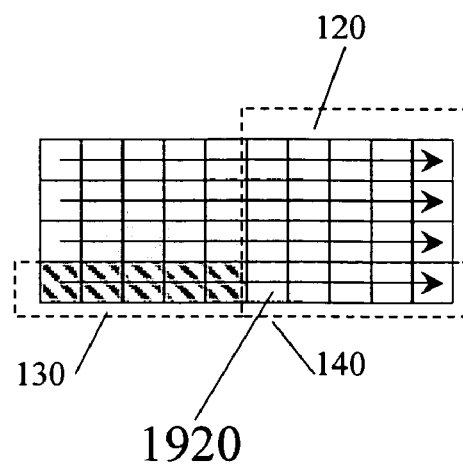

DECODER PERFORMANCE FOR BLOCK PRODUCT CODES

CROSSREFERENCE TO RELATED APPLICATION

This application is related to co-pending application Ser. No. 10/899,376, titled "DECODING BLOCK CODES," filed even date herewith and having the same ownership as the present application and to that extent related to the present application.

BACKGROUND

A codeword for a general two dimensional (2-D) (N,K) product code is arranged as illustrated in FIG. 1 below. N represents the codeword length while K represents the information length (e.g., number of information symbols or bits, length of the information sequence). A representative block product code codeword comprises $N_y$ rows of constituent code x (labeled "Code x") codewords and $N_x$ columns of constituent code y (labeled "Code y") codewords. Code x is a $(N_x, K_x)$ code, Code y is a $(N_y, K_y)$ code, $N = N_x \times N_y$, and $K = K_x \times K_y$. The 2-D block product code codeword 100 can be partitioned into four sub-rectangles, 110, 120, 130, and 140. In FIG. 1, the K-bit input information sequence is denoted by $s_i$, for $i = 0, \ldots, K-1$, while a parity bit is denoted by $p_{ij}$ for $i = 0, \ldots, K_y - 1$ and $j = K_x, \ldots, N_x - 1$, and for $i = K_y, \ldots, N_y - 1$ and $j = 0, \ldots, K_x - 1$. Product codes are also called block product codes ("BPCs"), block turbo codes, and block product turbo codes in the art. When soft information is processed by the block product code decoder, the decoder is sometimes called a block product turbo decoder and block turbo decoder in the art.

Though a maximum likelihood (ML) decoder theoretically provides the best (optimal) performance for decoding block product codes, the ML decoder for block product codes is generally impractical due to its complexity. One low complexity sub-optimal (non-ML) technique using hard-decision decoding of the constituent codes of the block product code is based on iterative techniques but this sub-optimal technique has poor performance. Recently, another sub-optimal technique for decoding block product codes was developed. The decoding can be performed iteratively using soft-input soft-output (SISO) constituent decoders operating on constituent codewords. A soft-input for the subsequent decoding phase may be computed using the soft-output from the current decoding phase in a similar manner to the decoding process for turbo codes. A decoding iteration can be divided into decoding phases as illustrated below. This iterative structure allows the constituent decoders of different dimensions to share information. For example, for the 2-D code illustrated in FIG. 1, the block product codeword is $N_y$ codewords to Code x, while simultaneously it is $N_x$ codewords to Code y. Therefore, both constituent decoder for Code x and constituent decoder for Code y can decode and generate information for the entire codeword. The information generated by the constituent decoders in one dimension can be passed to the constituent decoders in the other dimension together with the received signal, so that a better decoding decision can be made than if only the received signal is used.

While the optimal ML constituent decoder theoretically provides the best performance, its complexity is often impractical for constituent decoding. As a result, sub-optimal decoding techniques such as those employing Chase decoding that approximate the ML constituent decoder are attractive. A Chase decoder is one example of a soft-input soft-output (SISO) decoder for a constituent decoder. Upon receiving the soft-input vector for a (n, k) constituent block code, a binary vector Y and a set of test patterns are formed in the Chase decoder.

A hard-decision decoder, often a bounded-distance decoder, is used to decode each $X_i = (Y + Z_i)$ binary vector, where $Z_i$ denotes a member of the set of test patterns and for binary codes, the "+" can represent an exclusive-or operation. The hard-decision decoder can either produce a valid codeword or declare a decoding failure. Each valid codeword $C_i$ resulting from decoding $(Y + Z_i)$ is saved into a set S. A metric associated with each valid codeword is also saved. The Chase decoder attempts to generate a soft-output for every bit position j by finding the metric difference between two codewords in S, one codeword being the most-likely codeword D and the other being a best competing codeword $C_j$ which differs from D at position j, $1 \leq j \leq n$.

A flowchart 200 of the existing method of Chase decoding is shown in FIG. 2. Block 210 finds the L least reliable positions over a portion of the soft-input vector. Block 220 constructs a number of test patterns. In this example, $2^L$ test patterns are constructed. A Chase-L decoder uses $2^L$ test patterns. A loop index i is initialized to 1 in block 230. In block 240 within the loop, a hard-decision decoding of the binary vector $(Y + Z_i)$ is performed. If the hard-decision decoding finds a codeword, that codeword is saved to the set S and a corresponding metric is saved. The loop index i is incremented in block 242. A decision whether the loop index i less than or equal to the number of test patterns (in this case $2^L$) is made in block 245. If Yes, the loop 240-242 is repeated. If No, the soft-output vector is then generated based on the codewords in S and the associated metrics in block 250.

To meet decoding complexity constraints while ensuring adequate performance, the number of test patterns is kept small. However, when the hard-decision decoder declares a decoding failure for many of the test patterns, only a few codewords exist in S. As a result, a large number of positions in the soft-output vector will have inaccurate (or unavailable) soft-output values. For a block turbo decoder using a Chase decoder as a constituent decoder, it is desirable to have accurate soft-output values (and to have soft-output values for each position in a soft-output vector). One method to increase the number of codewords in S is to examine more test patterns. However, the Chase-(L+1) decoder has twice as many test patterns as the Chase-L decoder due to the exponential relationship between L and the number of test patterns, and doubling the number of test patterns within the constituent decoder can nearly double the complexity of the block turbo decoder.

Besides complexity, another problem for block product code decoding is the need to have a common decoder architecture capable of supporting various combinations of constituent codes for a block product code. In examining some of the codes in the ANSI/TIA-902.BAAD standard, there are 3-D block product codes as well as 2-D block product codes with non-identical constituent codes in each dimension. Further, there is a need to have a good performing (e.g., measured by low error rates) generic block turbo decoder.

BRIEF DESCRIPTION OF THE DRAWINGS

Certain embodiments illustrating organization and method of operation, together with objects and advantages may be best understood by reference to the detailed description that follows taken in conjunction with the accompanying drawings in which:

FIG. 4 illustrates the performance of x,y vs. y,x decoding order.

FIG. 5 is a flowchart to determine decoding order and to adjust decoding parameters.

FIG. 13 shows contour maps illustrating that the minimum block error rate contours move significantly as the SNR increases.

FIG. 17 is a frame error rate (FER) performance comparison of the non-adaptive method with L=4, 5, and the adaptive method with L=4.

FIG. 18 is an example of an x,y encoding order.

FIG. 19 is an example of a y,x encoding order.

DETAILED DESCRIPTION OF EXEMPLARY EMBODIMENTS

Figure 1:
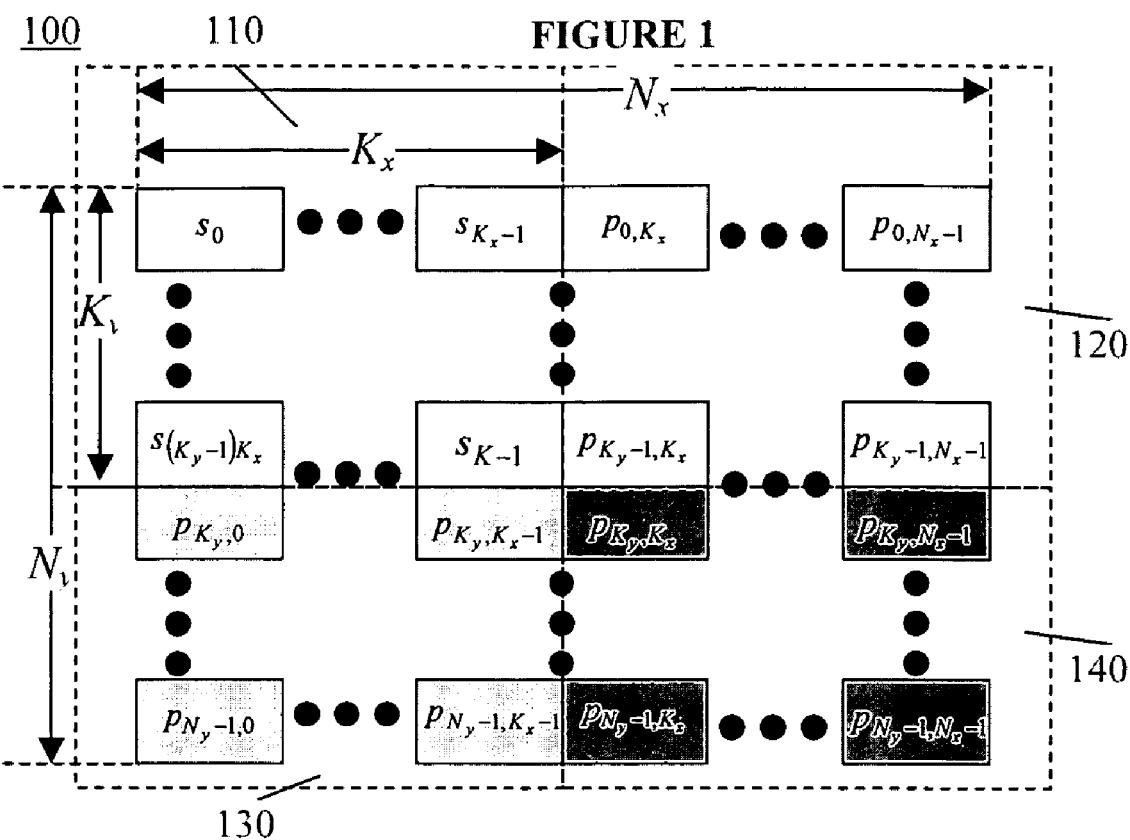
FIG. 1 is an example of a generic 2-dimensional block product code.
Figure 2:
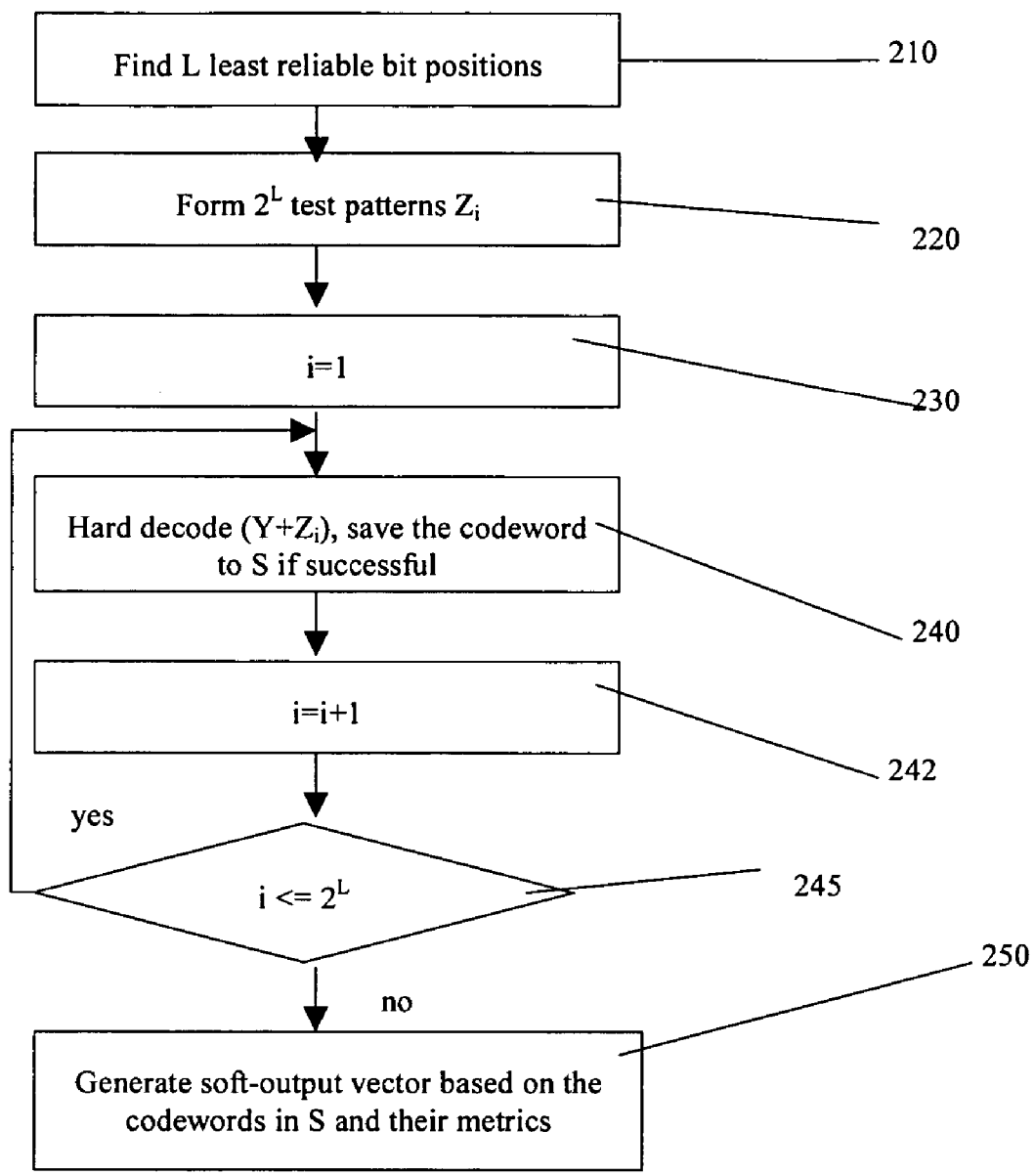
FIG. 2 is a simplified flow diagram of the process of using test patterns in a Chase decoder.

While this invention is susceptible of embodiment in many different forms, there is shown in the drawings and will herein be described in detail specific embodiments, with the understanding that the present disclosure of such embodiments is to be considered as an example of the principles and not intended to limit the invention to the specific embodiments shown and described. In the description below, like reference numerals are used to describe the same, similar or corresponding parts in the several views of the drawings.

The terms "a" or "an", as used herein, are defined as one or more than one. The term "plurality", as used herein, is defined as two or more than two. The term "another", as used herein, is defined as at least a second or more. The terms "including" and/or "having", as used herein, are defined as comprising (i.e., open language). The term "coupled", as used herein, is defined as connected, although not necessarily directly, and not necessarily mechanically. The term "program", as used herein, is defined as a sequence of instructions designed for execution on a computer system. A "program", or "computer program", may include a subroutine, a function, a procedure, an object method, an object implementation, in an executable application, an applet, a servlet, a source code, an object code, a shared library/dynamic load library and/or other sequence of instructions designed for execution on a computer system.

Block product codes can be defined to have systematic constituent codes in each dimension. Several frequently-used constituent codes as well as their minimum distance ($d_{min}$) properties are summarized in Table 1. The primitive binary BCH codes in Table 1 are defined over $GF(2^m)$ and have a t-bit guaranteed error-correcting capability when a bounded-distance hard-decision (hard-input hard-output) decoder is used. A t-error-correcting block code is imperfect if not all size-n binary vectors are within distance t to a codeword. $GF(2^m)$ represents a binary Galois field having $2^m$ elements. In the table, the codeword length n is also called the natural length of the code. In one example, the natural length of the code for a BCH code is $2^m-1$. In many applications, binary BCH codes are shortened by removing systematic bits to achieve a desired size. A code shortened from a BCH code with a minimum distance $d_{min}$ has a minimum distance of at least $d_{min}$. In general, for any block code, shortening assigns certain positions to known information values, such as zero. A severely shortened code has its n being much less than the natural length of the code.

TABLE 1

Minimum distances and unshortened natural lengths for several constituent codes.

| Constituent Code | natural Codeword Length n | Information Size k | $d_{min}$ |
| --- | --- | --- | --- |
| Single parity check (SPC) | k + 1 | k ≧ 1 | 2 |
| t = 1 binary BCH (i.e., Hamming) | $2^m - 1$ | $2^m - 1 - m$ | 3 |
| t = 1 extended binary BCH (i.e., Extended Hamming) | $2^m$ | $2^m - m$ | 4 |
| t = 2 binary BCH (labeled "t = 2 BCH") | $2^m - 1$ | $2^m - 1 - 2m$ | 5 |
| t = 2 extended binary BCH (labeled "t = 2 Extended BCH") | $2^m$ | $2^m - 2m$ | 6 |

The embodiments of the present invention are operable to support two or more than two dimensional (multidimensional) block product codes. In addition, these embodiments are applicable to any combination of constituent codes including the use of Hamming, BCH, Golay, single parity check (SPC) or any other block code. In the present invention, the soft information may be extrinsic information passed out of a constituent block code decoder in a block product code decoder (block turbo decoder), or may be the actual soft-outputs in any soft-input soft-output decoder of a constituent decoder. The block turbo decoder may also provide soft-outputs for other applications, such as joint equalizers/decoders and unequal error protection schemes. The block turbo decoder often produces a hard output that is an estimate of the transmitted information sequence.

The constituent decoder of the present invention may be a soft-output Chase decoder, Kaneko algorithm, or other soft-output decoding algorithm that may not always find a competing codeword for each bit position. For a Chase decoder, the lack of a competing codeword in a position is often due to decoding failures in an underlying hard-decision decoder. Decoding failures arise when the decoder cannot correct the error pattern that is encountered, a frequent occurrence when a bounded-distance decoder (i.e., a decoder that can only correct up to a set number of errors) is used to decode imperfect codes or shortened codes.

Certain embodiments consistent with the present invention improve block turbo decoder complexity and performance by:
a) permuting decoding parameters of the block turbo decoder to affect a preferred decoding order;
b) scaling extrinsic information to produce a soft-input for a soft-input soft-output constituent decoder,
c) detecting cases where a number of test patterns within the soft-input soft-output constituent decoder is insufficient to produce soft-output values.

Upon receiving a length N soft channel vector, a block turbo decoder attempts to produce a length K information sequence knowing that the length N soft channel vector corresponds to a (N,K) block product code. In certain embodiments, the block turbo decoder attempts to produce a length N soft-output vector. The received soft channel vector can be stored in memory given by an address X.

A two dimensional (2-D) block product code is specified by the notation "Code x-by-Code y", where Code x is the $(N_x,K_x)$ constituent code in the x dimension and Code y is the $(N_y,K_y)$ constituent code in the y dimension. Similarly, a three dimensional (3-D) block product code is specified by the notation "Code x-by-Code y-by-Code z", where Code z is the $(N_z,K_z)$ constituent code in the z dimension. Hence, a 2-D block product code comprises two constituent codes, specifically Code x and Code y. Similarly, a 3-D block product code comprises two or more (i.e., three) constituent codes, specifically Code x, Code y, and Code z. In certain embodiments, the notation "code 1", "code 2", etc., is used to specify constituent codes within a block product code but this notation is independent of the block product code specification. In certain embodiments, code 1 can represent Code x while code 2 can represent Code y. Further, in other embodiments, code 1 can represent Code y while code 2 can represent Code x. The mappings can be extended to higher dimensions. For notational purposes, code 1 is a $(N_1,K_1)$ constituent code, code 2 is a $(N_2,K_2)$ constituent code, etc.

Figure 3:
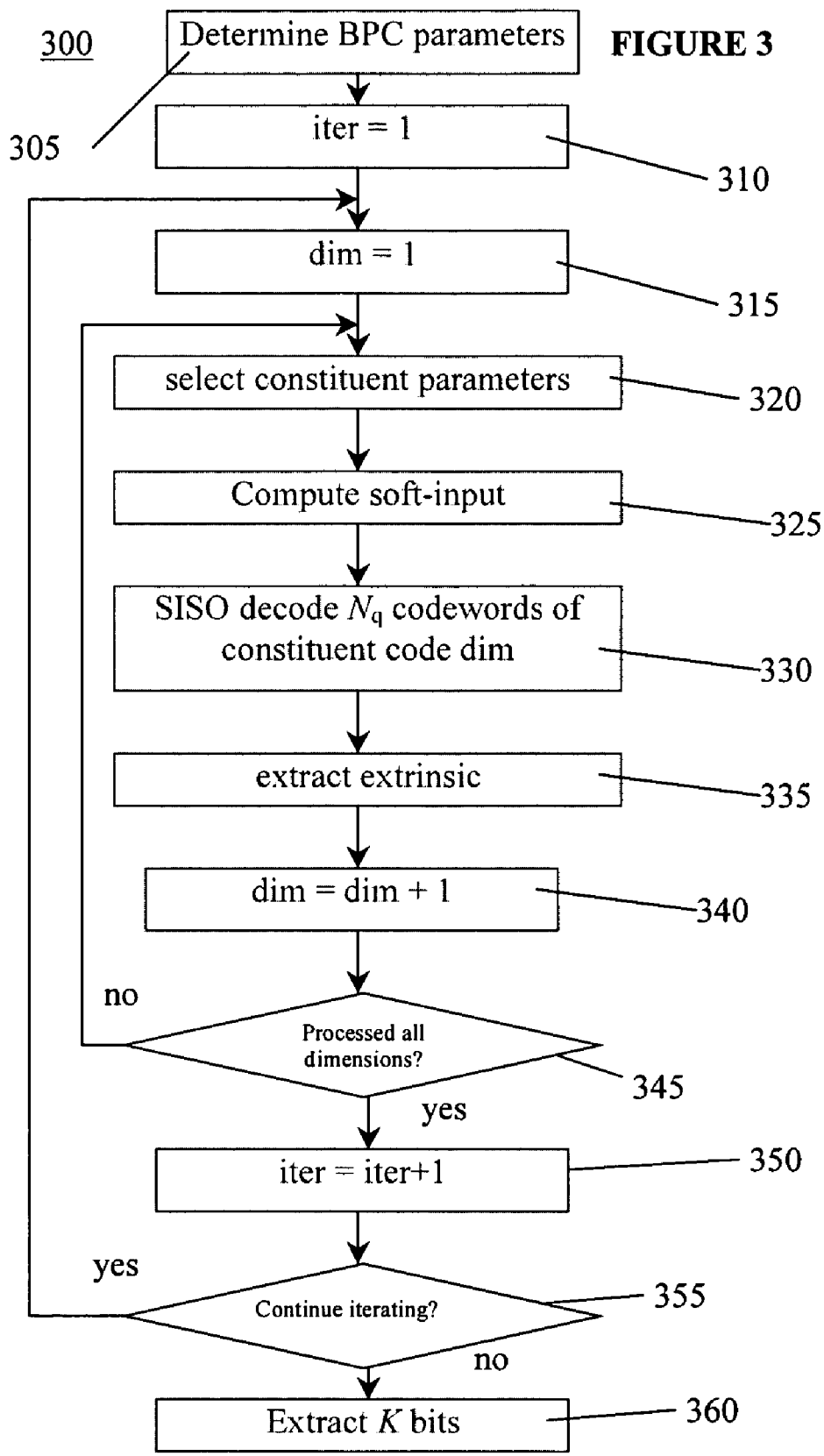
FIG. 3 is a flowchart of a method to decode block product codes.

FIG. 3 depicts a flowchart 300 of an embodiment for iterative decoding of block product codes. Block 305 determines the parameters for a particular block product code. Examples of the parameters include the decoding ordering, the number of codewords in each dimension of the particular block product code, the alpha parameters, a number of test patterns to generate for the constituent decoder in each dimension, and a maximum number of iterations. In certain embodiments, the parameters for a particular block product code can be stored in memory (table) and the process of determining the parameters for a particular block product code is a table lookup. In other embodiments, the parameters can be based on functions of the block product code parameters or other stored parameters. A loop index iter is initialized in 310. A loop index dim is initialized in 315. The loop indexing of dim (1, 2, 3, . . . ) corresponds to the preferred decoding order of the constituent codes. Block 320 selects the parameters for the constituent code in the dim-th dimension, which comprises one or more of the number of codewords to process ($N_q$), memory accessing parameters (e.g., starting address, memory stride size), an alpha vector, and a number of test patterns to generate for this constituent code. The determining of the parameters for the constituent code in the dim-th dimension (block 320) can involve accessing memory for those parameters. The selecting of the parameters (block 320) can involve processing statistics from a previous iteration. In the preferred embodiment, the soft-input for all the constituent decoders in the dim-th dimension is computed using the selected alpha vector in block 325. $N_q$ constituent decodings are performed in block 330. The $N_q$ constituent decodings can be viewed as "parallel decoding", where some or all constituent decodings in one dimension are performed at the same time. Further, in certain embodiments, the term "parallel decoding" can represent that the decoding of constituent codes in one dimension is performed before the constituent codes in another dimension are decoded. For certain embodiments, Table 2 lists some possible values of $N_q$ based on the decoding order. Extrinsic vectors are produced from the soft-output vectors (block 330) in block 335 for each soft-input computed in block 325. The dim index is incremented in block 340. A determination on whether all dimensions of the block product code are processed is made in block 345 for this iteration. If "no", the flow resumes at block 320. If "yes", the flow continues to block 350 where the index iter is incremented. A determination as to whether continuing the iterations is performed in 355. The determination can be based on, for example, whether iter has exceeded a maximum number of iterations, and/or whether some stopping rule criteria are met. Examples of stopping criteria are a cyclic redundancy check (if the information sequence has one), syndrome computation, estimated decoded bit error rate. If the determination is "yes", flow proceeds back to block 315. If the determination is "no", flow proceeds to block 360, where the K estimated information bits can be extracted. In certain embodiments, the determination for continuing the iteration, such as evaluating the stopping rule criteria, can be made in 345.

As FIG. 3 illustrates, a block turbo decoder can perform a parallel constituent decoding for a first dimension of a block product code, then a parallel constituent decoding for a second dimension, finally a parallel constituent decoding for the last dimension if the code is a three dimensional code. For a 2-D code for example, the last dimension is the second dimension. A decoding phase is one parallel constituent decoding. In certain embodiments, the decoding order of the constituent codes repeats for all iterations of the block turbo decoder. On the last iteration, the output of the parallel constituent decoding is taken as the output of the block decoder.

Decoding Order

The mapping of constituent codes of a block product code are Code x to code 1, Code y to code 2, and (for a 3-D code) Code z to code 3. This mapping can be called the natural decoding order. For some block product codes, the natural decoding order (decoding order determined by how the block product code is specified) may not be the decoding order that results in the best performance. In general, decoding performance of the block turbo decoder is a function of the decoding order especially if different constituent codes are used in each dimension.

For example, the effect of the decoding order on the error-correcting performance of the block turbo decoder is illustrated in FIG. 4. The block product code is a single parity check (SPC) code (4,3,2) by a shortened BCH code (30,20,5), where the notation $(n,k,d_{min})$ specifies a code with the codeword size (n), the number of information bits (k), and the minimum distance $d_{min}$ of the code. For simplicity, the notation "x,y" refers to the decoding order of decoding the x dimension first and the y dimension second while the notation "y,x" refers to the opposite decoding order. Similiar notation is adopted for the 3-D codes and higher dimensional codes. The x,y decoding order (the natural decoding order) decodes the SPC code first, and the y,x order decodes the BCH code first. The simulation conditions are additive white Gaussian noise (AWGN) channel and binary phase shift keying (BPSK) modulation. FIG. 4 shows that the x,y decoding order is about 0.45 dB better than the y,x order at a 1% frame error rate for this channel. This performance difference can increase to several decibels when the channel is not static.

An example 500 of how to implement a variable decoding order for a 2-D code is shown in FIG. 5. It is noted that a 2-D code is shown only for ease of illustration purposes and should not be construed as limiting any embodiments of the present invention. Block 510 determines the decoding parameters for the x,y decoding order. Examples of the decoding parameters include parameters that indexes to each codeword within a dimension, and the alpha parameters. Block 520 examines the constituent codes contained in the block product code. The examination can use the example for the preferred decoding order listed below. The examination can also be based on if Block 530 decides whether the x,y decoding order is the preferred order. If the x,y decoding order is not the preferred order, a permutation of the decoding parameters can then be performed as in Block 540. The block turbo decoder can use the permuted decoding parameters in Block 550 to decode the soft channel vector. In another embodiment, the constituent codes are examined, the decoding parameters for those codes are retrieved based on the examination, and finally used to decode the soft channel vector using the decoding parameters. The retrieved decoding parameters can be stored in memory and can reflect the preferred decoding order. These retrieved decoding parameters may already be permuted for the preferred decoding order.

Several example decoding orders are:

- The strongest constituent code (e.g., largest $d_{min}$) should be decoded last. The hard-decision output of the entire decoder should be used after the last dimension is decoded.
- For a block product code composed of different constituent codes, the weaker (smaller $d_{min}$) code should be decoded first. For example, a 3-D code composed of a t=2 BCH, an SPC and an extended Hamming (i.e., t=1 BCH) constituent codes, the SPC code is preferably decoded first.
- For a block product code composed of similar constituent codes, the longer code should be decoded first. For example, with a (11,10) SPC constituent code and a (23,22) SPC constituent code, the (23,22) SPC code is preferably decoded first.

Decoding order can also be determined empirically, such as by performing simulations and by characterizing performance in an actual decoder.

The flowchart 500 is one example of determining the parameters for a particular block product code. Table 2 provides an exemplary listing for the possible decoding orders for 2-D and 3-D block product codes as well as the number of constituent decoding performed for each dimension, given by $N_q$. Table 2 also shows the mapping between block product code specifications (i.e., Code x, Code y) to decoding order (code 1, code 2). In general, for a d-dimensional code, there are d factorial possible decoding orders. The notation "$\leftrightarrows$" refers to mapping of a constituent code for a particular dimension to a decoding order. For example, "code 1$\leftrightarrows$Code z" means that Code z is decoded first within an iteration.

TABLE 2

Possible decoding orders for 2-D and 3-D block product codes.

| Decoding Order | $N_q$ for code 1 | $N_q$ for code 2 | $N_q$ for code 3 |
|---|---|---|---|
| x, y (code 1 ↔ Code x), (code 2 ↔ Code y) | $N_y$ | $N_x$ | |
| y, x (code 1 ↔ Code y), (code 2 ↔ Code x) | $N_x$ | $N_y$ | |
| x, y, z (code 1 ↔ Code x), (code 2 ↔ Code y), (code 3 ↔ Code z) | $N_yN_z$ | $N_xN_z$ | $N_xN_y$ |
| x, z, y (code 1 ↔ Code x), (code 2 ↔ Code z), (code 3 ↔ Code y) | $N_yN_z$ | $N_xN_y$ | $N_xN_z$ |
| y, x, z (code 1 ↔ Code y), (code 2 ↔ Code x), (code 3 ↔ Code z) | $N_xN_z$ | $N_yN_z$ | $N_xN_y$ |
| y, z, x (code 1 ↔ Code y), (code 2 ↔ Code z), (code 3 ↔ Code x) | $N_xN_z$ | $N_xN_y$ | $N_yN_z$ |
| z, x, y (code 1 ↔ Code z), (code 2 ↔ Code x), (code 3 ↔ Code y) | $N_xN_y$ | $N_yN_z$ | $N_xN_z$ |
| z, y, x (code 1 ↔ Code z), (code 2 ↔ Code y), (code 3 ↔ Code x) | $N_xN_y$ | $N_xN_z$ | $N_yN_z$ |

In certain embodiments of the present invention, examining constituent codes to determine preferred decoding order can be implemented with a predetermined table.

Table 3 provides an exemplary set of starting addresses and memory stride sizes for a 2-D and 3-D block product code. The starting address is relative to the address X for the stored received soft channel vector. The starting address is the beginning of the soft value codeword (vector). The memory stride size is the memory spacing between successive elements of a vector. Table 3 is also applicable for 2-D codes when $N_z$ is set to 1 and the last row of the table is omitted. For example, if the z,x,y decoding order is specified, code 1 would use the starting address and memory stride size for Code z, code 2 would use the starting address and memory stride size for Code x, and code 3 would use the starting address and memory stride size for Code y. In certain embodiments, Table 3 can also be used to store the extrinsic vector in appropriate locations of memory. Similarly, Table 3 can be used to access extrinsic vectors for generating the soft-input.

TABLE 3

Location of codewords.

| | Starting Address | Memory Stride Size | ranges |
|---|---|---|---|
| Codewords of Code x | $j N_xN_y + i N_x$ | 1 | $0 \leq j \leq N_z - 1$ $0 \leq i \leq N_y - 1$ |
| Codewords of Code y | $j N_xN_y + i$ | $N_x$ | $0 \leq j \leq N_z - 1$ $0 \leq i \leq N_x - 1$ |
| Codewords of Code z | $j N_x + i$ | $N_xN_y$ | $0 \leq j \leq N_y - 1$ $0 \leq i \leq N_x - 1$ |

Alpha Parameters

The soft-input and soft-output of each bit position in a given codeword can be, for example, a likelihood ratio or log-likelihood ratio (LLR) as is commonly used in maximum likelihood (ML) decoding and maximum a posterior (MAP) decoding. When LLRs are used, the soft-input is called the input LLR, and the soft-output is called the output LLR. The extrinsic LLR of a given bit position is a function of the LLRs of the other bits in the codeword and is generated from the input LLR, and is used to compute the input LLR for the next decoding phase. In one example, the extrinsic LLR is the difference between the output LLR and input LLR. It is noted that soft information or a function of the received soft information could be used in place of the log likelihood ratios without departing from the spirit and scope of the present invention. Furthermore, a "value" is an element of a "vector". Soft information can be either a soft-output or an extrinsic LLR. In certain embodiments, a codeword can be represented by a vector. The "bit position" can be used to identify the location of a value within a vector. Hence, the number of bit positions is equivalent to the number of values. In the following figures and equations, calculations and operations are described in terms of LLRs. One skilled in the art can use other forms of soft values with their corresponding calculations and operations.

Figure 6:
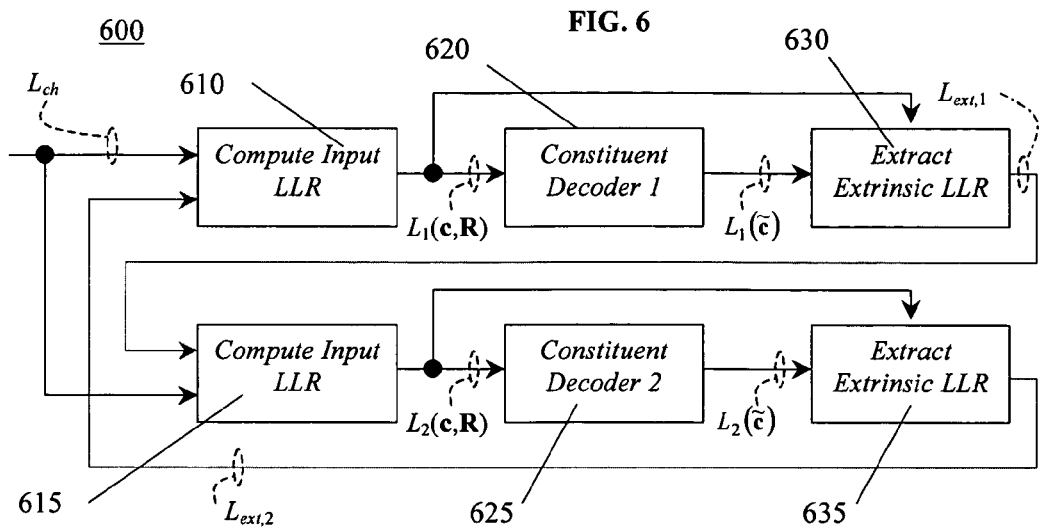
FIG. 6 illustrates a block diagram of a 2-D block turbo decoder.

FIG. 6, circuit 600, illustrates certain embodiments for a 2-D block product code. $L_{ch}$ is the input channel LLR corresponding to the received length N soft channel vector, $L_i(\tilde{c})$ is the output of the i-th SISO decoder, $L_{ext,i}$ is the extrinsic LLR from the i-th constituent decoder, and $L_i(c,R)$ is the input of i-th SISO decoder (i.e., the soft-input, input LLR) where c is a codeword vector and R is the received soft channel vector. The most likely codeword vector is denoted by $\tilde{c}$. The extrinsic LLR from a previous decoding phase becomes the a priori inputs for the current decoding phase.

The "Compute Input LLR" blocks 610, 615 in FIG. 6 generate the input LLRs for the SISO constituent decoders (block 620, 625). A straightforward method of computing the input LLR $L_i(c,R)$ is $$L_i(c,R)=L_{ch}+L_{ext,j}, \text{ for } j \neq i, \ i,j \in \{1,2\} \quad (1)$$

based on the channel LLR $L_{ch}$ and extrinsic LLR $L_{ext,j}$ extracted in blocks 630, 635. The subscript i refers to decoding the i-th constituent code, while the subscript j refers to the j-th constituent decoder. This method can cause degraded performance due to early convergence to the wrong codeword. Instead, a scaled extrinsic LLR, $$L_i(c,R)=L_{ch}+\alpha_{i,j}L_{ext,j}, \text{ for } j \neq i, \ i,j \in \{1,2\} \quad (2)$$

where $0 \leq \alpha_{i,j} \leq 1$, can be used to generate the input LLR for a 2-D code. In the notation for the alpha parameter $\alpha_{i,j}$, the subscript i refers to the i-th (current) constituent code, and the subscript j refers to the extrinsic LLR from the j-th (previous) constituent decoder. Scaling the extrinsic LLR places less confidence in the individual constituent decoder outputs, but may avoid convergence to the wrong codeword.

In FIG. 6, when decoding constituent code 1, the current constituent code is code 1 and the previous set of constituent codes is code 2. The alpha vector for constituent code 1 is $[\alpha_{1,2}]$ and is selected from the determined alpha parameters $\{\alpha_{1,2}, \alpha_{2,1}\}$. Block 610 first retrieves $L_{ext,2}$, the one or more extrinsic vectors for the previous set of constituent codes (code 2) and generates, using equation (2), the soft-input vector $L_1(c,R)$ from the soft channel vector ($L_{ch}$) and the dot product of the alpha vector $[\alpha_{1,2}]$ and the retrieved one or more extrinsic vectors for the previous set of constituent codes. Block 620 then decodes the generated soft-input vector using a soft-input soft-output decoder for code 1 and produces the soft information vector $L_1(\tilde{c})$. Block 630 produces the extrinsic vector $L_{ext,1}$, which is stored for use in the next decoding phase. In the next decoding phase (decoding constituent code 2), the current constituent code is code 2 and the previous set of constituent codes is code 1.

Figure 7:
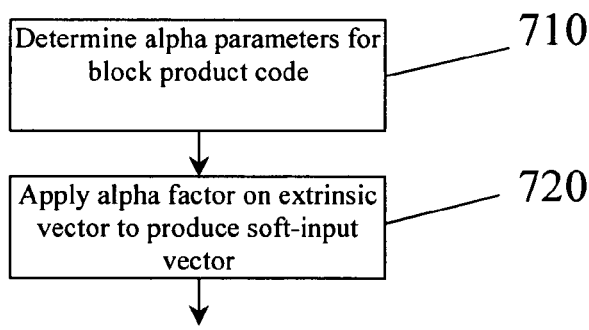
FIG. 7 is a flowchart to determine the alpha parameters as a function of the constituents of the block product code.
Figure 8:
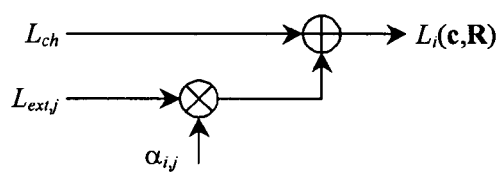
FIG. 8 illustrates a circuit for generating a soft input vector.

FIG. 7 illustrates a method 700 to determine the alpha parameters (block 710) and apply the alpha parameters to produce the soft-input vector (block 720). Block 710 may determine the alpha parameters as a function of the block product code constituents. The parameters can also be computed off-line. Note that in certain embodiments the extrinsic vector from a parallel constituent decoder in one dimension becomes part of the soft-input vector for a parallel constituent decoder in another dimension. FIG. 8 shows the resulting circuit 800 for implementing equation (2).

Figure 9:
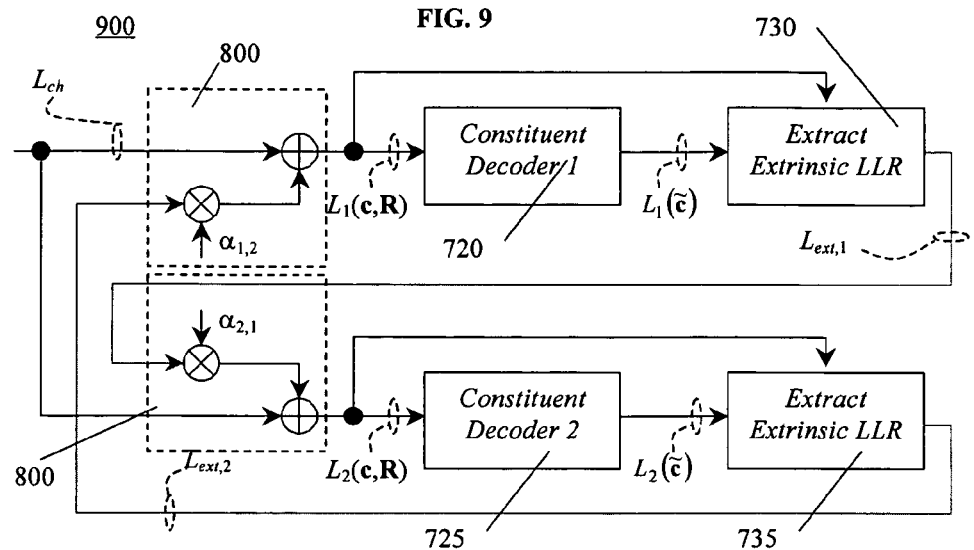
FIG. 9 is a block diagram of a 2-D decoder incorporating alpha parameters.

Substituting circuit 800 into the Compute Input LLR blocks 610, 615 in FIG. 6 produces the 2-D decoder structure 900 shown in FIG. 9.

In certain embodiments, $\alpha_{1,2}$ (denoted as $\alpha_1$ for 2-D codes) and $\alpha_{2,1}$ (denoted as $\alpha_2$ for 2-D codes) take on values $0 \leq \alpha_1 \leq 1$ and $0 \leq \alpha_2 \leq 1$, respectively. The alpha parameters (i.e., $\alpha_1$ and $\alpha_2$) attempt to balance the reliability of extrinsic LLRs with the type of constituent codes used. For example, the reliability of the extrinsic LLRs when a t=2 BCH constituent decoder is used is different than the reliability when an SPC constituent decoder is used. The alpha parameters help the overall block turbo decoder to converge to the correct codeword.

Figure 10:
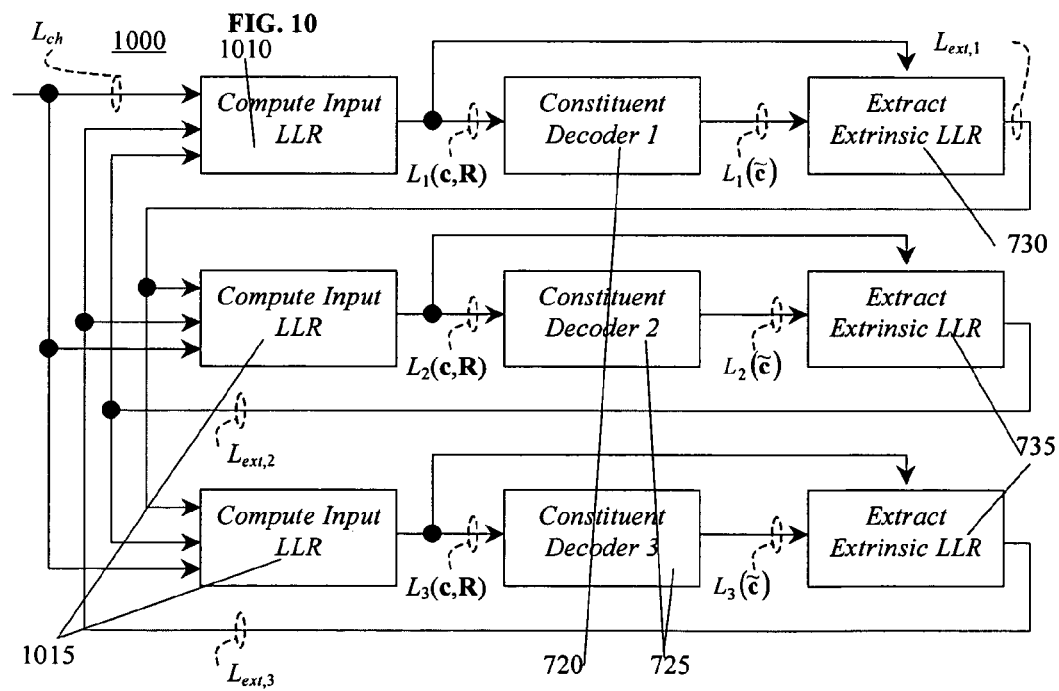
FIG. 10 illustrates a block diagram of a 2-D block turbo decoder.

The "Compute Input LLR" blocks 1010, 1015 in FIG. 10, circuit 1000, generate the soft-inputs vectors for the SISO constituent decoders (block 620, 625) using the extrinsic LLR $L_{ext}$ extracted in blocks 630, 635.

Figure 11:
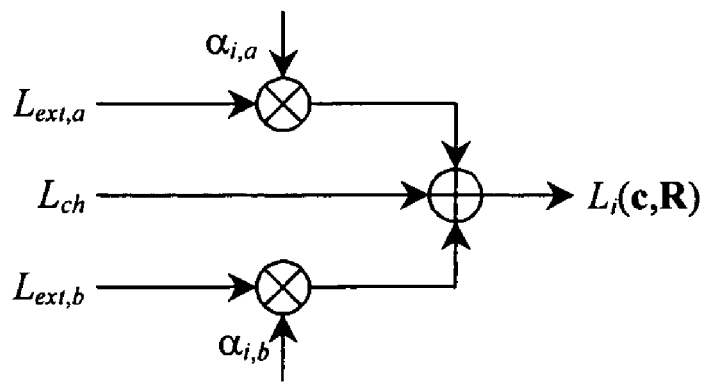
FIG. 11 is an example of LLR scaling for a 3-D decoder.

For 3-D codes, each extrinsic LLR input is scaled by a distinct alpha parameter, as shown in circuit 1100 of FIG. 11. For example, to produce the input LLR for constituent decoder i, $\alpha_{i,a}$ scales the extrinsic LLR from constituent decoder a while $\alpha_{i,b}$ scales the extrinsic LLR from constituent decoder b.

In certain embodiments, a method of decoding a block product code having two or more constituent codes includes:
  receiving a soft channel vector;
  determining alpha parameters based on the two or more constituent codes;
  determining a decoding order based on the two or more constituent codes;
  partitioning the two or more constituent codes into a current constituent code and a previous set of constituent codes;
  selecting an alpha vector for the current constituent code from the determined alpha parameters;
  retrieving one or more extrinsic vectors for the previous set of constituent codes;
  generating a soft-input vector for a soft-input soft-output decoder for the current constituent code wherein the soft-input vector is a sum of the soft channel vector and a dot product of the retrieved one or more extrinsic vectors and the selected alpha vector;
  decoding the generated soft-input vector using the soft-input soft-output decoder for the current constituent code to produce an extrinsic vector for the current constituent code; and
  storing the extrinsic vector for the current constituent code.

In FIG. 10, when decoding constituent code 1, the current constituent code is code 1 and the previous set of constituent codes is code 2 and code 3. The alpha vector for constituent code 1 is $[\alpha_{1,2}, \alpha_{1,3}]$ and is selected from the determined alpha parameters $\{\alpha_{1,2}, \alpha_{1,3}, \alpha_{2,1}, \alpha_{2,3}, \alpha_{3,1}, \alpha_{3,3}\}$. Block 1010 first retrieves $L_{ext,2}$ and $L_{ext,3}$, the one or more extrinsic vectors for the previous set of constituent codes (code 2 and code 3) and generates, using equation (4), the soft-input vector $L_1(c,R)$ from the soft channel vector ($L_{ch}$) and the dot product of the alpha vector [$\alpha_{1,2}, \alpha_{1,3}$] and the retrieved one or more extrinsic vectors for the previous set of constituent codes. Block 620 then decodes the generated soft-input vector using a soft-input soft-output decoder for code 1 and produces the soft information vector $L_1(\tilde{c})$. Block 630 produces the extrinsic vector $L_{ext,1}$, which is stored for use in the next decoding phase. In the next decoding phase (decoding constituent code 2), the current constituent code is code 2 and the previous set of constituent codes is code 1 and code 3.

For a 2-D code, the input LLRs of constituent decoder 1 and 2 can be expressed as $$\begin{cases} L_1(c_j, r_j) = L_{ch}(c_j) + \alpha_{1,2} L_{ext,2}(c_j), & 1 \le j \le N_1, \\ L_2(c_j, r_j) = L_{ch}(c_j) + \alpha_{2,1} L_{ext,1}(c_j), & 1 \le j \le N_2, \end{cases} \quad (3)$$

respectively, where $N_1$ is the codeword length of constituent block code 1, and $N_2$ is the codeword length of constituent block code 2. In certain embodiments, $\alpha_{1,2}$ is called $\alpha_1$ and $\alpha_{2,1}$ is called $\alpha_2$. Similarly, for a 3-D code, the input LLRs of the constituent decoders can be expressed as $$\begin{cases} L_1(c_j, r_j) = L_{ch}(c_j) + \alpha_{1,2} L_{ext,2}(c_j), + \alpha_{1,3} L_{ext,3}(c_j), & 1 \le j \le N_1 \\ L_2(c_j, r_j) = L_{ch}(c_j) + \alpha_{2,1} L_{ext,1}(c_j), + \alpha_{2,3} L_{ext,3}(c_j), & 1 \le j \le N_2, \\ L_3(c_j, r_j) = L_{ch}(c_j) + \alpha_{3,1} L_{ext,1}(c_j), + \alpha_{3,2} L_{ext,2}(c_j), & 1 \le j \le N_3, \end{cases} \quad (4)$$

For a 3-D code, to simplify implementation, in certain embodiments alpha parameters $\alpha_{1,2}$ and $\alpha_{1,3}$ are equal to each other, $\alpha_{2,1}$ and $\alpha_{2,3}$ are equal to each other, and $\alpha_{3,1}$ and $\alpha_{3,2}$ are equal to each other. In these cases, $\alpha_1$ is used to denote $\alpha_{1,2}$ and $\alpha_{1,3}$, $\alpha_3$ is used to denote $\alpha_{2,1}$ and $\alpha_{2,3}$, and $\alpha_2$ is used to denote $\alpha_{3,1}$ and $\alpha_{3,2}$.

Equations (3) and (4) can be generalized to $$L_g(c_j, r_j) = L_{ch}(c_j) + \sum_{\substack{p=1 \\ p \ne g}}^{dim} \alpha_{g,p} L_{ext,p}(c_j), \quad 1 \le j \le N_g \quad (5)$$

where dim is the dimensionality of block product code and g ranges between 1 and dim.

The alpha parameters, in general, can vary as a function of the iteration, decoding order, operating conditions (e.g., signal-to-noise ratio), block product code dimension, constituent code combinations, and the extract extrinsic LLR operation. In order to limit the set of alpha parameters the decoder uses, a goal of an alpha parameter determination procedure is to find a set of parameters that only depends on the properties of the constituent code combinations. For example, this goal would be to find one set of parameters ($\alpha_1$ and $\alpha_2$) that could be used for all $d_{min}$=16 2-D block product codes with two extended Hamming code constituents each constructed over $GF(2^6)$.

The alpha parameter scaling as illustrated by equations (3), (4), and (5) is a linear procedure which is required for an overall scale tolerant decoder. In a linear procedure, if $f(x_1)=y_1$ and $f(x_2)=y_2$, then $f(ax_1+bx_2)=ay_1+by_2$. A scale tolerant decoder facilitates implementation on both hardware and software, such as software running on a Motorola DSP56300 processor. A scale tolerant decoder makes the same output decisions regardless of the scaling on the soft channel vector. Operations such as scaling by the mean of a vector are not scale tolerant.

As an example, to determine the alpha parameters, a series of simulations were performed by examining 100 combinations of $\alpha_1$ and $\alpha_2$ in the range of 0.1 to 1.0 in 0.1 increments. One criterion for selecting the alpha parameters is choosing the combination that results in the lowest block error rate for a range of signal-to-noise ratios (SNRs). Due to the potentially large number of results, a contour map plotting the relationship between $\alpha_1$, $\alpha_2$, and the block error rate is used for each SNR value. Another criterion the decoded bit error rate (after some iterations or each iteration).

Another display technique is to use multiple tables or use plots of performance, such as bit error rate (frame error rate) as a function of signal quality for different parameters combinations.

Figure 12:
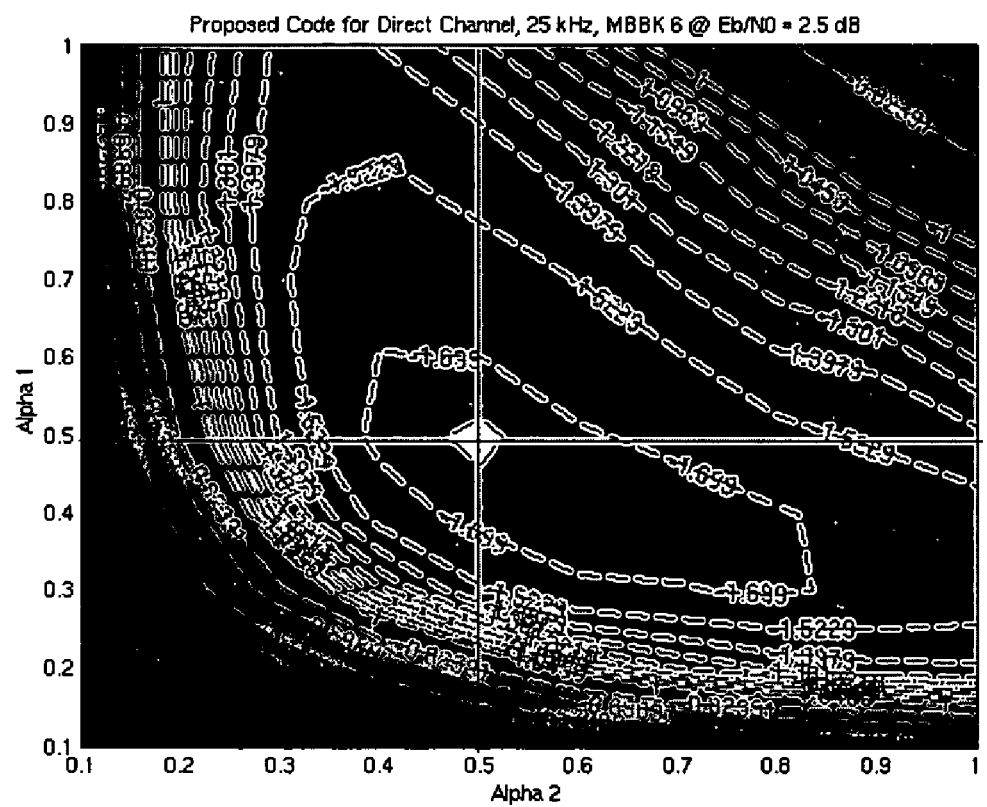
FIG. 12 is a contour map showing contours at $E_b/N_0=2.5$ dB after four decoding iterations.

To illustrate this contour map, a (31,24) extended Hamming code [Code x]—by-(20,13) extended Hamming code [Code y] block product code with $d_{min}$=16 is used as an example. Both codes are constructed over $GF(2^6)$ and shortened by 33 and 44 positions, respectively. FIG. 12 shows the contours at $E_b/N_0$=2.5 dB after four decoding iterations. The xy decoding order is used.

In FIG. 12, the contours start at 0 and decrease to −1.824. The levels represent $\log_{10}$ of the block error rate for a particular combination of $\alpha_1$ and $\alpha_2$. The 0 contour represents 100% block error rate while the −1.824 contour indicates that the block error rate is less than $1.5 \times 10^{-2}$. Further, the region bounded by the −1.523 and the −1.699 contours indicates the block rate error ranges between $2 \times 10^{-2}$ and $3 \times 10^{-2}$. The contours are systematically arranged so that lines corresponding to block error rates of 9, 8, 7, 6, 5, 4, 3, 2, 1.5, and 1 are shown for each power of ten. The mapping of the contour values to the block error rate is tabulated in Table 4. The horizontal axis, labeled Alpha 2, shows the range of $\alpha_2$ (for the second constituent decoder), while the vertical axis shows the range of $\alpha_1$ for the first decoder. Because the x,y decoding order is used, the second constituent decoder decodes Code y.

TABLE 4

Mapping of contour line values to block error rates.
For example, a contour value of −1.115 corresponds
to a block error rate of $7.0 \times 10^{-2}$.

| Contour Line Value | Block Error Rate |
| --- | --- |
| −i | $1.0 \times 10^{-i}$ |
| −i.046 | $9.0 \times 10^{-i-1}$ |
| −i.097 | $8.0 \times 10^{-i-1}$ |
| −i.155 | $7.0 \times 10^{-i-1}$ |
| −i.222 | $6.0 \times 10^{-i-1}$ |
| −i.301 | $5.0 \times 10^{-i-1}$ |
| −i.398 | $4.0 \times 10^{-i-1}$ |
| −i.523 | $3.0 \times 10^{-i-1}$ |
| −i.699 | $2.0 \times 10^{-i-1}$ |
| −i.824 | $1.5 \times 10^{-i-1}$ |

In examining FIG. 12, combinations of small $\alpha_1$ and $\alpha_2$ (<0.3) cause a high block error rate in the block turbo decoder after four iterations. Also causing a high block error rate but not as severe are combinations of large $\alpha_1$ and $\alpha_2$ (>0.8). The combination of $\alpha_1$=0.5 and $\alpha_2$=0.5, shown by the intersecting lines, is in the region with the lowest block error rate (less than $1.5 \times 10^{-2}$).

Having just one set of alpha parameters for all SNRs can lower decoder implementation complexity. However, from a system perspective, there may be cases where having alpha parameters be dependent on the SNR is desired. For example, if in certain embodiments the system is designed to operate at both a very high error rate, as well as low error rate, the alpha parameters should be chosen based on SNR for best decoder performance.

The alpha selection procedure can also be used to identify constituent code combinations that cause poor block turbo decoder performance. A particular example is a $d_{min}$=16 2-D block product code having a (29,23) extended Hamming code [Code x] and a (19,12) extended Hamming code [Code y]. Code x is constructed over $GF(2^5)$ and shortened by 3 positions while Code y is constructed over $GF(2^6)$ and shortened by 45 positions. Analysis of the alpha selection procedure, shown in FIG. 13, reveals that the minimum block error rate contours move significantly as the SNR increases. The intersection of the lines in the subfigures are denoted by $(\alpha_1,\alpha_2)$. Subfigure 1310 shows contours for $E_b/N_0$=2.5 dB, and $(\alpha_1,\alpha_2)$=(0.7,0.4). Subfigure 1320 shows contours for $E_b/N_0$=3.0 dB, and $(\alpha_1,\alpha_2)$=(0.6,0.45). Subfigure 1330 shows contours for $E_b/N_0$=3.5 dB, and $(\alpha_1,\alpha_2)$= (0.8,0.28)). Subfigure 1340 shows contours for $E_b/N_0$=4.0 dB, and $(\alpha_1,\alpha_2)$=(0.95,0.22). Further, the absence of smooth contours in subfigure 1340 indicates that the block error rate performance can be extremely sensitive to the choice of alpha parameters, and that one choice of alpha parameters for certain SNR points can be inadequate for a broad SNR range.

The different set of alpha parameters as a function of SNR may be attributed to the severe shortening of Code y. Severe shortening can cause the soft-input soft-output decoder (i.e., Chase decoder) to produce a very small set of codewords in set S for Code y. In some instances, the soft-input soft-output decoder found zero or one valid codewords. Frequently, the underlying hard-decision BCH decoder within the soft-input soft-output decoder may determine that errors are located in the shortened positions, which leads to invalid codewords. The very limited number of codewords can cause the soft-output vector to have unavailable values for a large number of bit positions. One method to reduce the number of unavailable values is to increase the number of test patterns processed by the Chase decoder.

A set of alpha parameters for a variety of 2-D and 3-D block product codes are listed in Table 5 based on four decoding iterations and a target block error rates <$10^{-3}$. The use of $\alpha_{x'}$, $\alpha_{y'}$, and $\alpha_{z'}$ instead of $\alpha_x$, $\alpha_y$, and $\alpha_z$ is to make Table 5 independant of constituent code ordering in the block product code. The x', y', and z' (for a 3-D code) entries in Table 5 for each block product code type/constituent code length may be different than the specified x, y, and z order for the constituent codes. For a given set of alpha parameters in Table 5, values near the listed entries can also be used. For example, the listed alpha parameters for the 2-D Hamming× Hamming with natural code lengths of 32×32 are 0.45 and 0.45. Using values of 0.42 and 0.48 for $\alpha_{x'}$ and $\alpha_{y'}$, respectively, is also acceptable (e.g., little performance degradation). One set of criteria for selecting these alpha parameters are:

Independence of iteration index,
Independence of operating conditions (i.e., SNR),
Follows some guidelines for decoding order,
Reduces implementation complexity for 3-D decoders, and
Best combination of parameters for block error rates less than $10^{-3}$.

If no recommended values are provided, in certain embodiments a value of approximately 0.5 should be used. The use of $\alpha_{x'}$, $\alpha_{y'}$, and $\alpha_{z'}$ instead of $\alpha_x$, $\alpha_y$,and $\alpha_z$ in Table 5 illustrates the determining the alpha parameters (block 710 of FIG. 7). In certain embodiments, determining the alpha parameters can compute the $d_{min}$ for the block product code, find the natural length for each constituent code, and sort by constituent code type and natural length. Then Table 5 can be used to determine $\alpha_{x'}$ and $\alpha_{y'}$ ($\alpha_{x'}$, $\alpha_{y'}$, and $\alpha_{z'}$ for a 3-D code). The determined alpha parameters would then be mapped to the alpha parameters of the natural decoding order. The subsequent determining of the decoding order may permute these determined alpha parameters according to the preferred decoding order.

The following example illustrates one embodiment. Consider a (30,20,5) BCH-by-(4,3,2) SPC code block product code. The only entry in Table 5 for this $d_{min}$=10 block product code specifies $\alpha_{x'}$=0.3 and $\alpha_{y'}$=0.6. The type of block product code is SPC×BCH (t=2). Since the natural decoding order is BCH (t=2)-by-SPC, $\alpha_x$=$\alpha_{y'}$ and $\alpha_y$=$\alpha_{x'}$. The recommended decoding order, as illustrated by FIG. 4, has the SPC code decoded first. Hence, $\alpha_1$=$\alpha_y$=$\alpha_{x'}$ and $\alpha_2$=$\alpha_x$=$\alpha_{y'}$.

TABLE 5

| Dim | Type | Code Lengths for Unshortened Codes | $d_{min}$ | $\alpha_{x'}$ | $\alpha_{y'}$ | $\alpha_{z'}$ |
|---|---|---|---|---|---|---|
| 2 | Hamming × Hamming | 64 × 64, 64 × 32, 64 × 16 | 16 | 0.5 | 0.4 | |
| 2 | Hamming × Hamming | 32 × 32 | 16 | 0.45 | 0.45 | |
| 2 | Hamming × Hamming | 32 × 16 | 16 | 0.5 | 0.45 | |
| 2 | Hamming × Hamming | 32 × 15 | 12 | 0.5 | 0.5 | |
| 2 | Hamming × Hamming | 31 × 16, 63 × 32 | 12 | 0.5 | 0.6 | |
| 2 | Hamming × Hamming | 16 × 15 | 12 | 0.6 | 0.6 | |
| 2 | Hamming × Hamming | 63 × 31, 31 × 31, 31 × 15, 15 × 15 | 9 | 0.6 | 0.6 | |
| 2 | Hamming × BCH (t = 2) | | 15, 18, 20, 24 | 0.35 | 0.55 | |
| 2 | SPC × Hamming | | 8 | 0.6 | 0.6 | |
| 2 | SPC × BCH (t = 2) | | 10, 12 | 0.3 | 0.6 | |
| 3 | SPC × SPC × SPC | | 8 | 0.7 | 0.7 | 0.7 |
| 3 | SPC × SPC × Hamming | | 16 | 0.5 | 0.7 | 0.5 |

The observations about parameter choices in Table 5 are as follows:

Block product codes with a larger minimum distance are more heavily scaled (i.e., smaller alpha).
3-D codes are lightly scaled (e.g., larger alpha).
For more powerful codes, such as constituent codes with high $d_{min}$, the scaling factors may also have to be balanced between the constituents.

For 2-D $d_{min}=16$ codes, the soft-input calculation for the shorter natural length code constituent decoder has more scaling (i.e., smaller alpha, more heavily scaled).

For 2-D $d_{min}=12$ codes, the soft-input calculation for the constituent decoder for the $d_{min}=3$ mixed length has more scaling. The soft-input calculation for the constituent decoder for the longer code of mixed length codes has more scaling.

For 3-D $d_{min}=16$ codes, one SPC code is given a larger alpha than the other.

For codes with extreme shortening (e.g., where the codeword length is less than half the natural length), the alpha parameters may have to be determined empirically.

In certain embodiments, such as in a low complexity implementation, the value of α can initially be set to zero. Setting to zero may eliminate the need to assign (e.g., initialize) values for the extrinsic vectors (i.e., the one or more extrinsic vectors for the previous set of constituent codes) at the beginning of block product code decoding. After the extrinsic vectors are generated, the value of α can change to the recommended values.

An example of this low complexity implementation is shown for a 3-D block product code. The determined alpha parameters comprises the set $\{0, \alpha_{1,2}, \alpha_{1,3}, \alpha_{2,1}, \alpha_{2,3}, \alpha_{3,1}, \alpha_{3,3}\}$. In the first iteration, the selected alpha vector for the first (current) constituent code is [0,0]. The extrinsic vectors ($L_{ext,2}$ and $L_{ext,3}$) (i.e., from the previous constituent codes) contain unknown values. By setting the selected alpha vector to [0,0], the extrinsic vectors ($L_{ext,2}$ and $L_{ext,3}$) do not have to be initialized prior to computing the soft-input vector for the first constituent decoder. After the first constituent decoding, $L_{ext,2}$ and $L_{ext,3}$ still contain unknown values but $L_{ext,1}$ contains known values. In the next decoding phase (of the first iteration), the selected alpha vector for the second constituent code is $[\alpha_{2,1},0]$. The alpha parameter applied to $L_{ext,1}$ is $\alpha_{2,1}$ because $L_{ext,1}$ contains known values. The alpha parameter applied to $L_{ext,3}$ is 0 because $L_{ext,3}$ still contains unknown values. After the second constituent decoding, only $L_{ext,3}$ still contains unknown values but both $L_{ext,1}$ and $L_{ext,2}$ contain known values. In the next decoding phase (of the first iteration), the selected alpha vector for the third constituent code is $[\alpha_{3,1},\alpha_{3,2}]$ because both $L_{ext,1}$ and $L_{ext,2}$ contain known values. After the third constituent decoding, $L_{ext,3}$ contains known values. In subsequent decoding phases, the selected alpha vector for the first constituent code is $[\alpha_{1,2},\alpha_{1,3}]$, the selected alpha vector for the second constituent code is $[\alpha_{2,1},\alpha_{2,3}]$, and the selected alpha vector for the third constituent code is $[\alpha_{3,1},\alpha_{3,2}]$ Matching Bit Ordering Matching bit ordering provides an efficient interface between the encoder/decoder and the bit ordering required in order to comply with a standard such as the ANSI/TIA-902.BAAD standard. In the ANSI/TIA-902.BAAD standard, the bit ordering for 2-D block product codes is consistent with the bit ordering used in certain embodiments of the present invention. The conventional approach for bit ordering is described by Table 3. However, in the 3-D block product code used in the ANSI/TIA-902.BAAD standard, a somewhat non-conventional approach is used. In this non-conventional approach, the 3-D block product code is treated as a 2-D block product code. Each row of the 2-D block product code corresponds to a xy plane of the 3-D block code. Hence, Code y of the 2-D code is Code z of the 3-D code, while Code x of the 2-D code is a systematic permuted version of Code x and Code y of the 3-D code.

Consider an $(N_x,K_x) \times (N_y,K_y) \times (N_z,K_z)$ 3-D block product code in which there are $K=(K_x \times K_y \times K_z)$ information bits and $N=(N_x \times N_y \times N_z)$ code bits. In order to represent the encoded 3-D code in the format specified in the ANSI/TIA-902.BAAD standard, certain embodiments of the present invention perform a 3-D encoding and then perform permutations on groups of $N_x \times N_y$ bits to create the ANSI/TIA-902.BAAD standard formatted output. The permutation is performed subject to the restriction that the information bits come before the parity check bits within each permuted $N_x \times N_y$ group. Similarly, prior to decoding, in certain embodiments permutations on successive groups of $N_x \times N_y$ received values are performed on the ANSI/TIA-902.BAAD standard formatted output to create an ordering suitable for the decoder. The permutation is performed so that within each group of $N_x \times N_y$ received values, the first $N_x \times K_y$ received values are permuted. The permutation maps these $N_x \times K_y$ received values to locations suitable for block turbo decoding.

Changing Test Patterns

Figure 14:
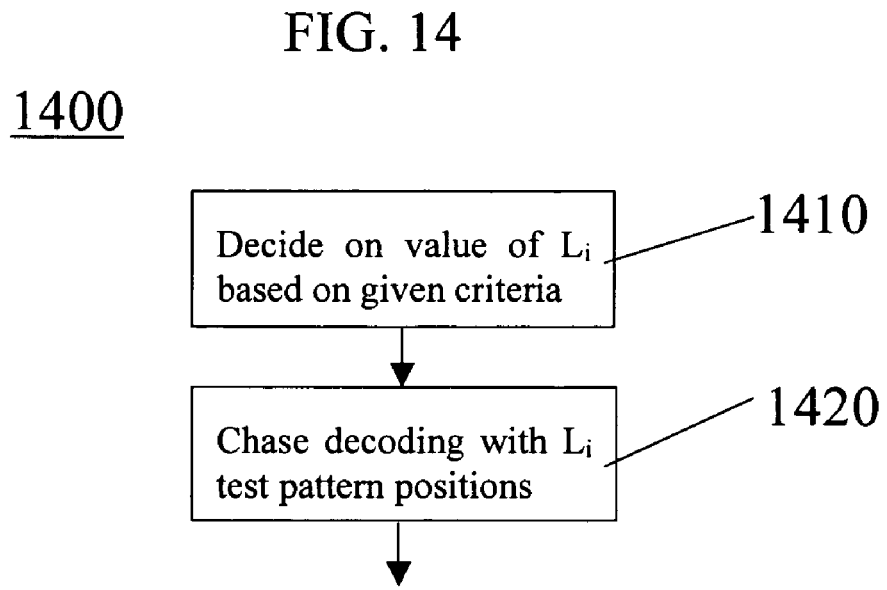
FIG. 14 is a flowchart of the method to decode code i among a set of block codes.

In certain embodiments, the number of test patterns processed by a soft-input soft-output decoder, such as a Chase decoder, can vary. A flowchart 1400 of the certain embodiments is shown in FIG. 14 to decode code i which can be one of the constituent codes of the block product code. FIG. 14 shows that the certain embodiments decide the number of test pattern positions $L_i$ (block 1410) before Chase decoding as in block 1420. The number of test patterns for code i can be related to $L_i$. In one example, the number of test patterns is $2^{L_i}$.

In one embodiment, when the number of test patterns is insufficient for performance reasons, the number of test patterns processed by the soft-input soft-output decoder is increased. One possible reason for increasing a number of test patterns (hence increasing L) is when the underlying hard-decision decoder within the soft-input soft-output decoder declares a decoder failure for many of the test patterns. Thus, the set S only has a few codewords to generate a soft-output vector. As a result, a large number of positions in the soft-output vector can have inaccurate (unavailable) soft-output values, which may degrade performance of the overall decoder, such as the block turbo decoder. The hard-decision decoder declares a decoder failure more frequently when severely shortened and/or imperfect block codes are used as the constituent codes for a block product code.

Figure 15:
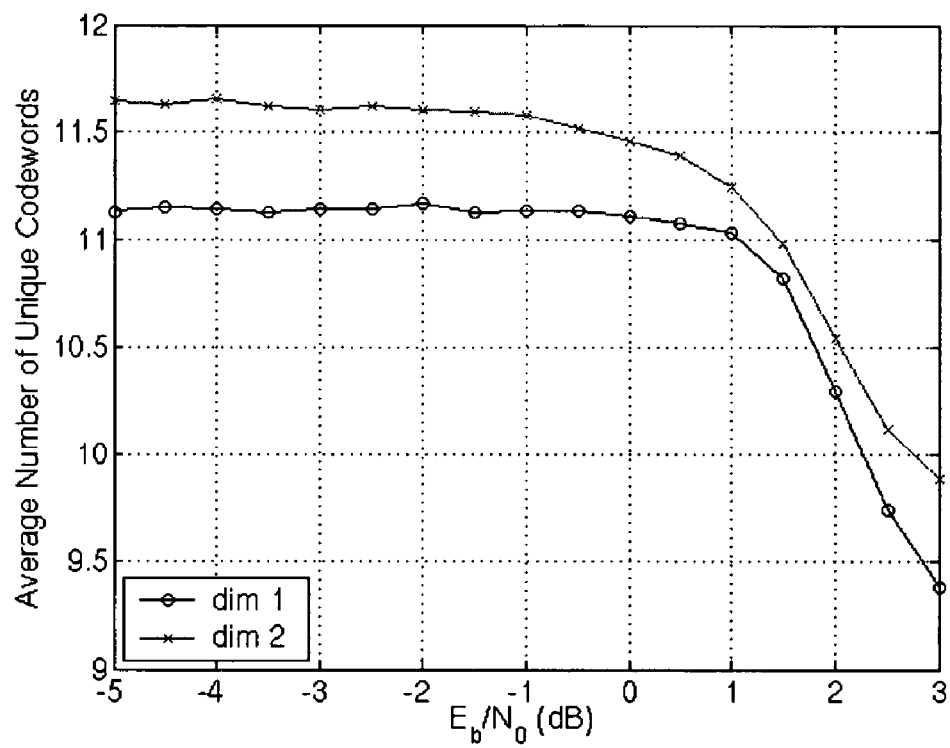
FIG. 15 is a graph showing the average number of unique codewords in set S in each dimension as a function of $E_b/N_0$ (dB).

If a Chase decoder is required to decode two or more codes, which can be constituent codes of a block product code, it is desirable to allow a different L for each constituent code instead of using the same L for all constituent codes. As illustrated in FIG. 15, two different constituent codes using the same number of test patterns can have different number of unique codewords in set S at the same SNR ratio, suggesting that different constituent codes may need a different number of test patterns. Since in certain embodiments the number of test patterns, hence the decoding complexity for a code, is exponentially related to L, allowing the Chase decoder to use a different L for each code can significantly reduce the decoding complexity without degrading performance. For example, a Chase decoder may need to decode four BCH codes $C_i$, i=1, . . . , 4, and a minimum of $L_1=4$, $L_2=4$, $L_3=4$, and $L_4=5$ is required by each code to achieve acceptable performance. If the same L is used for all codes, then $L=\max(L_1, L_2, L_3, L_4)=5$ should be used for all four codes, leading to processing a total of $4 \times 2^L=128$ test patterns. In contrast, an adjustable-L Chase decoder would use $L_i$, to decode code $C_i$, leading to processing a total of $(2^{L1}+2^{L2}+2^{L3}+2^{L4})=80$ test patterns.

For another set of block product codes in certain embodiments, using a number of test patterns based on L may cause the complexity of the block turbo decoder to exceed processing constraints for particular block product codes. In that case, it is desirable to use a number of test patterns based on L−1 (e.g., use L=3 instead of L=4 for a subset of the block product codes) to meet the processing constraints while possibly degrading the performance of the block turbo decoder for those particular block product codes, but not degrading performance for the remainder of the block product codes in the set. Hence, there is a need to allow the number of test patterns, which is based on L, to vary on a constituent code basis for many block product codes.

Due to the exponential relationship between L and the number of test patterns, a Chase-(L−1) decoder has half as many test patterns as a Chase-L decoder. Halving the number of test patterns can nearly halve the complexity of the constituent decoder. Since the block turbo decoder often uses a Chase decoder with binary BCH codes, the complexity of the block turbo decoder can be related to the complexity of the Chase decoder. Hence, halving the complexity of the constituent decoder can significantly reduce the complexity of the block turbo decoder.

The necessary number of test patterns can vary as a function of channel conditions. For example, more test patterns may be needed at high signal-to-noise ratios compared to low signal-to-noise ratios. As illustrated by example in FIG. 15, with the same number of test patterns, the number of unique codewords in set S decreases as the SNR increases. A smaller number of unique codewords implies that there are more bit positions where the Chase decoder does not have a metric difference. This suggests that at high SNRs more test patterns may be necessary to produce a sufficient number of unique codewords. Hence, there can be a need to adjust the number of test patterns, which is related to L, as a function of channel conditions. FIG. 15 plots the average number of unique codewords in set S in each dimension as a function of $E_b/N_0$ (dB). The simulation conditions are additive white gaussian noise (AWGN) channel, BPSK modulation, 16 test patterns, and 4 iterations. The block product code is the outbound 150, 1.5 MBBK channel defined in the ANSI/TIA-902.BAAD standard. The first dimension is a (49, 42, 4) BCH code, the second dimension is a (29, 23, 4) BCH code.

For many constituent codes, the number of valid codewords produced by the Chase decoder may change significantly while the block turbo decoder iterates. For example, at the beginning of block product code decoding, the Chase decoder may only need to process a small number of test patterns to produce a sufficient number of valid codewords. In this example, L can be smaller for the early iterations, and larger for later iterations, so that the number of test patterns varies as the decoder iterates. Hence, the decoder may allow the number of test patterns, which is based on L, to vary on a constituent code basis as a function of the decoding iteration. It is noted that the number of test patterns can vary based upon: a percentage of shortening for the constituent code; an information from a previous decoding iteration; an amount of shortening of the constituent codeword; an iteration number of the block turbo decoder; a constituent codeword length; a type of constituent code; and a number of test patterns required for a previous decoding iteration.

There are several possible criteria that can be used to decide the value of $L_i$ for a particular constituent code. In certain embodiments, the criterion can be the percentage of shortening for the constituent code. In this example, the value of $L_i$ for that constituent code can be determined before the block turbo decoder begins decoding. In a second embodiment, the value of $L_i$ is determined using information from a previous decoding iteration. For example, suppose the Chase decoder provides a number of bit positions in the soft-output vector that have inaccurate soft-output values from a previous decoding iteration. The action of deciding on the value of $L_i$ can examine this number. For example, if this number is greater than a first threshold, the value of $L_i$ can be increased, thereby potentially reducing the number of positions having inaccurate soft-output values in this iteration. In another example, if this number is less than a second threshold, the value of $L_i$ can be reduced, thereby reducing the decoding complexity while maintaining performance.

The proposed method allows a specific L for each constituent code. This method can tailor decoding complexity as well as performance. In the above example, the first constituent code that needs extra test patterns can use L+1 to specify the number of test patterns, while a second constituent code could use L.

The method is readily extended to other conditions, e.g., determining L for each block product code in a set of block product codes. For example, for the set of block product codes defined in the ANSI/TIA-902.BAAD standard, some block turbo decoders may use L=5, while other block turbo decoders use L=4. This leads to a significant complexity reduction in comparison to using L=5 for the whole set of block product codes. In another example, some other block turbo decoders can use L=3 for constituent codes in one dimension while using L=4 for constituent codes in another dimension to meet both performance requirements and complexity constraints. In yet another example, some other block turbo decoders can use L=3 for complexity reasons.

In certain embodiments, the decoder itself (either hardware or software implementation) contains extra gates/code to support multiple test pattern sets and the ability to select different maximum numbers of test patterns that would not otherwise be present. The extra components may include tables of different sets of test patterns and extra memory to store competing codewords.

In certain embodiments, the test patterns include all $2^L$ combinations of binary zeros and ones at the L positions of Y having the least reliability in the associated soft-input vector.

In certain embodiments the least reliable positions have the smallest magnitudes. Let r denote the length of the portion of the soft-input vector over which the search for the L least reliable positions is performed, where $r \leq n$. In certain embodiments, a test pattern $Z_i$ has a length of r and has at least r-L binary zeros and the remaining positions are be set to a binary one. The position of the ones can be related to the L least reliable positions of the portion of the soft-input vector.

Adaptive Method

In certain embodiments, the number of test patterns processed by the Chase decoder is determined adaptively. This adaptive method uses an augmented test pattern $Z_i'$ when a hard-decision decoding based on the test pattern $Z_i$ is unable to find a valid codeword. The adaptive method processes a soft-input vector to generate the soft-output vector, comprising:

Finding a L+α least reliable positions within a portion of the soft-input vector, wherein L and α are positive integers;

Constructing a set of test patterns $Z_i$ with a number of test patterns related to L;

For each test pattern vector $Z_i$, performing a hard-decision decoding with a hard-decision decoder on a binary vector $X_i=(Y+Z_i)$ wherein a binary vector Y is constructed from the soft-input vector;

If the hard-decision decoder finds a valid codeword $C_i$ associated with the binary vector $(Y+Z_i)$, the valid codeword $C_i$ is saved into a set S;

If the hard-decision decoder is unable to find a valid codeword, construct an augmented test pattern $Z_i'$ using at least one element of the α positions;

If hard-decision decoding the augmented binary vector $(Y+Z_i')$ finds a valid codeword $C_i'$ associated with the binary vector $(Y+Z_i')$, the valid codeword $C_i'$ is saved into a set S; and Generate the soft-output vector based on the set S.

The L+α least reliable positions may be divided into a first portion of positions with L elements and a second portion of positions with α elements. In some instances, a valid codeword may not be produced with the augmented test pattern.

Figure 16:
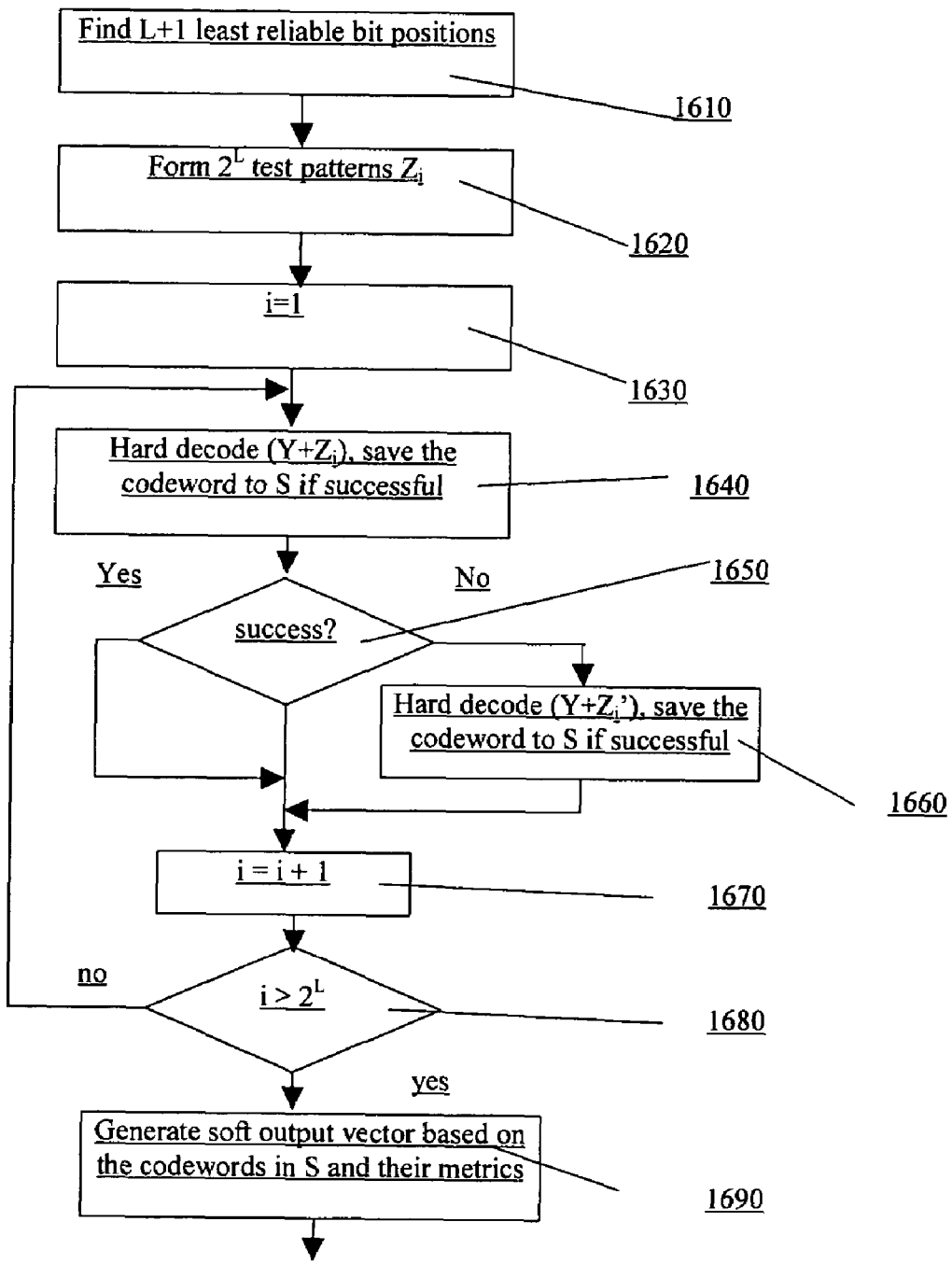
FIG. 16 is a flow chart of the adaptive Chase decoding method.

A flowchart 1600 of the adaptive method is shown in FIG. 16 for α=1. Block 1610 finds the L+1 least reliable positions over a portion of the soft-input vector. Block 1620 constructs $2^L$ test patterns on the L least reliable bit positions.

The index i is initialized to 1 in block 1630. In block 1640 within the loop, a hard-decision decoding of the binary vector $(Y+Z_i)$ is performed. If the hard-decision decoding finds a codeword $C_i$ ("Yes" in block 1650), that codeword is saved to the set S and the corresponding metric is saved.

If the hard-decision decoder fails to find a codeword ("No" in block 1650) using the binary vector $(Y+Z_i)$, an augmented test pattern $Z_i'$ is created. The augmented test pattern is related to the test pattern $Z_i$. In one embodiment, the augment test pattern $Z_i'$ and the test pattern $Z_i$ differ by one bit. The one-bit difference is related to the (L+1)-th least reliable position. An augmented binary vector $(Y+Z_i')$ is constructed using the augmented test pattern $Z_i'$. A hard-decision decoding of the augmented binary vector (Y+Zi') is then performed in block 1660. If the hard-decision decoding finds a codeword $C_i'$, that codeword is saved to the set S and the corresponding metric is saved. The index i is incremented in block 1670. A determination of whether the index exceeds the number of test patterns is made in block 1680. In "No", the flow proceeds back to block 1640. If the determination in 1680 is "Yes", the soft-output vector is generated based on the codewords in S and their metrics in block 1690.

Although the above discussion is limited to α=1, the adaptive method can be easily extended to approximate decoders with $2^{L+\alpha}$ test patterns for α>1. For example, constructing the augmented binary vector and hard-decision decoding of the augmented binary vector can be repeated if α>1. The complexity would increase accordingly when α>1. However, for α=1 the worst-case complexity is still related to $2^L$ because a test pattern is not augmented unless there is a hard-decision decoding failure, and the maximum possible number of codewords used in the soft-output computation (which dominates decoding complexity for simple codes) is still $2^L$.

The adaptive method has a decoding performance close to that of a Chase decoder that uses test patterns that are a function of L+1. This is because if $(Y+Z_i)$ leads to an invalid codeword, decoding the augmented binary vector $(Y+Z_i')$ is more likely to result in a valid codeword. In FIG. 17, the frame error rate performance of the adaptive method is plotted against the existing method for the (19, 12, 4) BCH-by-(29, 23, 4) BCH block product code, which is specified for the inbound 100 kHz 3 MBBK channel of the ANSI/TIA-902.BAAD standard. The (19,12,4) BCH code is severely shortened from the (64,57,4) BCH code. The simulation conditions are AWGN channel and BPSK modulation. The existing method with L=4 is inadequate as indicated by an error floor. Using the adaptive method, the error floor is eliminated. In addition the performance is only about 0.1 dB worse than an L=5 decoder, with much less complexity. In general, differences of a decibel in an AWGN channel can appear as several decibels differences in more severe multipath faded channels.

The following example in accordance with certain embodiments of the present invention illustrates the process of finding the least reliable bit positions, forming the test patterns $Z_i$ and $Z_i'$, and showing the relationship between $Z_i$ and $Z_i'$.

Suppose a block code is a (7,4) binary BCH code with $d_{min}=3$ and t=1, and a transmitted binary codeword is $[1, 0, 0, 1, 1, 1, 0]^T$, where superscript T denotes transpose. After the transmission across a channel, a received soft-input vector is $[-0.011810, -0.001221, 0.018524, -0.012573, -0.015930, 0.003296, 0.035583]^T$. In certain embodiments of the present invention, if a value is centered around zero, a sign of the value can indicate a hard estimate of the given bit and a magnitude of the value can indicate a reliability of the hard estimate. Assuming that the soft-input vector represents LLRs centered around zero, positive LLRs map into binary zeros, and negative LLRs map into binary ones. The binary vector Y corresponding to (created from) the soft-input vector is $[1, 1, 0, 1, 1, 0, 0]^T$. In this example, the creation of binary vector Y is based on the sign of the soft-input vector. Let L=2 and α=1. With the numbering starting at 1, the L+α=3 smallest magnitudes of the soft-input vector are positions 2, 6, and 1 (in increasing magnitude order) and the L least-reliable positions are used to construct the set of test patterns $Z_i$. For L=2, there are $2^L=4$ possible test patterns. The test pattern mapping between the L=2-bit binary word and the 4 possible test patterns $Z_i$ is

| | | | | | | | |
|---|---|---|---|---|---|---|---|
| 00 | ⇔ [0 | 0 | 0 | 0 | 0 | 0 | $0]^T$ |
| 01 | ⇔ [0 | 1 | 0 | 0 | 0 | 0 | $0]^T$ |
| 11 | ⇔ [0 | 1 | 0 | 0 | 0 | 1 | $0]^T$ |
| 10 | ⇔ [0 | 0 | 0 | 0 | 0 | 1 | $0]^T$ |

In accordance with certain embodiments of the invention, if the hard-decision decoding of $Y+Z_i$ (using test pattern mapping 00) is unsuccessful, an augmented test pattern $Z_i'$

| | | | | | | | |
|---|---|---|---|---|---|---|---|
| 100 | ⇔ [1 | 0 | 0 | 0 | 0 | 0 | $0]^T$ | is constructed from $Z_i$. The augmented test pattern $Z_i'$ (mapping 100) differs from $Z_i$ (mapping 00) in one position (one bit) which is the location of the (L+α)-th (third) least reliable position of the soft-input vector. Similarly, for the test pattern mapping 01, the corresponding augmented test pattern $Z_i'$ is $$101 \Leftrightarrow [1 \quad 1 \quad 0 \quad 0 \quad 0 \quad 0 \quad 0]^T.$$

Proceeding with this example, for α=2, the (L+α)-th (fourth) least reliable position of the soft-input vector is position 4. Hence, if the hard-decision decoder is unable to produce a codeword using the test pattern $Z_i$ (test pattern mapping 00) or using the first augmented test pattern $Z_i'$ (100), when α=2, another augmented test pattern $Z_i'$ (labeled $Z_i''$) can be constructed from the first augmented test pattern $Z_i'$. In particular, $Z_i''$ is $$1100 \Leftrightarrow [1 \quad 0 \quad 0 \quad 1 \quad 0 \quad 0 \quad 0]^T,$$

which differs from $Z_i'$ by one bit. $Z_i''$ differs from $Z_i$ by two bits. In relation to the test pattern $Z_i$, the augmented test pattern $Z_i''$ differs by a positions. In general, a test pattern $Z_i$ and the augmented test pattern $Z_i'$ can differ by at most a positions.

Alternatively, another augmented test pattern $$1000 \Leftrightarrow [0 \quad 0 \quad 0 \quad 1 \quad 0 \quad 0 \quad 0]^T,$$

could be used in addition to 1100.

Compared to the existing method, the adaptive method (for α=1) can require: an extra search to get the (L+1)-th least reliable bit position; construction of the augmented test pattern $Z_i'$ if needed; and hard-decision decoding of the augmented binary vector $(Y+Z_i')$ if needed. In addition, because the adaptive method on average places more codewords in S, generating the soft-output may require an increased search to find the best competing codeword $C_j$ which differs from the most-likely codeword D at position j, $1 \leq j \leq n$.

The adaptive method can be used with other types of Chase decoding loops. In one example, suppose that the number of codewords in S is below some threshold after the set of test patterns, whose number is related to L, are examined. The adaptive method can be used and a set of augmented test patterns can be constructed. Additional hard-decision decoding can then be performed on the set of augmented binary test vectors. Another criterion to use the adaptive method is when the number of unavailable soft-output values from a previous decoding iteration in a block turbo decoder is below some threshold.

In addition, in some embodiments, the adaptive method can be enabled based on certain criteria. Some possible criteria for enabling this adaptive method can be the type of code the Chase decoder is decoding; the operating point; and the specific received codeword. For example, the decision whether to enable the adaptive method can be made in block 320 of FIG. 3. It is also noted that a different number of test patterns can be used during each decoding iteration of a block turbo decoder. It is further noted that different constituent codes of a block product code can in general have a different number of test patterns.

Encoding Order

In addition to encoding at a transmitter, encoding can be performed at the receiver. In one application, a stopping rule criterion in block 355 of FIG. 3 may be based on an estimated decoded bit error rate. The decoded information sequence may be re-encoded to produce an estimated codeword $c_{est}$. The received vector (soft channel vector R) can be sliced to produce an received codeword $c_{rx}$. The number of differences between $c_{est}$ and $c_{rx}$ can be related to a bit error rate.

In certain embodiments, a method of encoding an information sequence with a block product code while minimizing complexity (e.g., measured by cycle time, number of operations, and instruction count) is:

1) determining an encoding order for the block product code;
2) permuting encoding parameters for the block product code based on the determination; and
3) encoding the information sequence using the permuted encoding parameters.

A block product code specification does not indicate a procedure for encoding a K-bit information sequence. For example, referring again to FIG. 1, when the constituent codes of a (N,K) block product code are systematic, only N−K parity bits need to be determined by the encoder. Let the $N_x \times N_y$ code rectangle be partitioned in four sub-rectangles 110, 120, 130, and 140 as shown in FIG. 1. The K-bit input information sequence can be placed into systematic positions which are located in the $K_x \times K_y$ sub-rectangle 110. While the first $K_y$ rows of Code x parity bits (sub-rectangle 120) and the first $K_x$ columns of Code y parity bits (sub-rectangle 130) have to be encoded by Code x and Code y, respectively, the remaining parity bits (sub-rectangle 140) are shared by both Code x and Code y. The shared parity bits in sub-rectangle 140 can be equivalently obtained from Code x or Code y.

The 2-D block product code example shows that two equivalent encoding procedures are possible. One procedure to determine the N−K parity bits is to first generate the parity bits for the $(N_x, K_x)$ constituent code in the first $K_y$ rows of 100. The result of this fills the $(N_x-K_x) \times K_y$ sub-rectangle 120. Next the remaining positions (sub-rectangles 130 and 140) are filled by encoding all $N_x$ columns of the $(N_y, K_y)$ constituent code. This x,y order procedure 1800 is illustrated in FIG. 18. The x,y order refers to operating on Code x first as in subplot 1810 and then Code y as in subplot 1820. Note, one skilled in the art could fill sub-rectangle 130 first, then sub-rectangle 120, and finally sub-rectangle 140. This possible filling procedure is still the same as the x,y order in that the filling of sub-rectangle 140 is based on encoding the $(N_y, K_y)$ constituent code.

The other procedure 1900, the y,x order, is illustrated in FIG. 19. In this procedure, $K_x$ encodings of the $(N_y, K_y)$ constituent code are first performed (filling sub-rectangle 130 as shown in subplot 1910). To fill the remaining positions (sub-rectangles 120 and 140), $N_y$ encodings of the $(N_x, K_x)$ constituent code are then performed as shown in subplot 1920.

While both encoding procedures produce the same codeword, they may have different implementation complexities. In certain embodiments, this choice of the encoding procedure (i.e., encoding order) can be determined by evaluating complexity. For instance, in a software implementation, let the cost of generating a length $N_i$ constituent codeword be $C_i$ cycles per bit, where $i \in \{x, y\}$ for a 2-D code and $i \in \{x, y, z\}$ for a 3-D code. Then, for a 2-D code, the complexity of the x,y order, $C_{x,y}$, is $$C_{x,y} = K_y(N_x C_x) + N_x(N_y C_y) \quad (6)$$

cycles while complexity of the y,x order, $C_{y,x}$, is $$C_{y,x}=K_x(N_yC_y)+N_y(N_xC_x) \quad (7)$$

cycles. For some processors, such as a Motorola DSP56300, the cycle count is related to the instruction count and operation count. When the constituent code complexities are known, Equations (6) and (7) can be evaluated to determine the encoding order that has the lower complexity. Equations (6) and (7) should not be considered limiting. One skilled in the art can use a more detailed complexity formula to account for additional overhead.

The 2-D complexity formula given by Equations (6) and (7) can easily be extended to higher dimensionality block product codes. Table 6 illustrates the six possible encoding complexities for a 3-D block product code encoder. In general, for a dim-dimensional block product code, there are dim factorial possible encoding orders. The encoding complexity formulas in equations (6) and (7) are easily extended to dim dimensions. The determining an encoding order can be based on the lowest implementation complexity.

TABLE 6

Encoding order complexity for 3-D block product codes.

| Encoding order | Complexity (Cycles) |
| --- | --- |
| x, y, z order | $C_{x,y,z} = K_yK_z(N_xC_x) + N_xK_z(N_yC_y) + N_xN_y(N_zC_z)$ |
| x, z, y order | $C_{x,z,y} = K_zK_y(N_xC_x) + N_xK_y(N_zC_z) + N_xN_z(N_yC_y)$ |
| y, x, z order | $C_{y,x,z} = K_xK_z(N_yC_y) + N_yK_z(N_xC_x) + N_yN_x(N_zC_z)$ |
| y, z, x order | $C_{y,z,x} = K_zK_x(N_yC_y) + N_yK_x(N_zC_z) + N_yN_z(N_xC_x)$ |
| z, x, y order | $C_{z,x,y} = K_xK_y(N_zC_z) + N_zK_y(N_xC_x) + N_zN_x(N_yC_y)$ |
| z, y, x order | $C_{z,y,x} = K_yK_x(N_zC_z) + N_zK_x(N_yC_y) + N_zN_y(N_xC_x)$ |

For example, consider a block product code where Code x is a (54,47) extended Hamming code and Code y is a (15,9) extended Hamming code. Because Code x and Code y are both extended Hamming codes, their implementation complexity costs per bit are approximately equal. Hence, a common complexity can be used, i.e., $C=C_x=C_y$. Substituting the code parameters in (6) and (7) shows that the x,y order has a complexity of (9×54C)+(54×15C)=1296C cycles while the y,x order has a complexity of (47×15C)+(15×54C) =1515C cycles. Using the x,y order saves 219C cycles. This savings can be exploited, for example, when a digital signal processor, such as a Motorola DSP56300 DSP, has high loading.

In another example, an illustration of using Table 6 is presented. Consider a 3-D block product code constructed as a (7,6) SPC×(13,12) SPC×(16,11) extended Hamming code. Assuming that the complexity for encoding a Hamming code is 5 cycles per bit (i.e., $C_z$=5n) while the complexity for encoding a SPC code is 1 cycle per bit (i.e., $C_x=C_y$=1n). Table 7 represents the results of the complexity analysis (using Table 6) for this example where Code x is the (7,6) SPC code, Code y is the (13,12) SPC code, and Code z is the (16,11) extended Hamming code. As Table 7 indicates, the z,y,x order provides the lowest complexity.

TABLE 7

Complexity table for the example.

| | Complexity (cycles) |
| --- | --- |
| x, y, z order | 9205 |
| x, z, y order | 9100 |
| y, x, z order | 9139 |
| y, z, x order | 8554 |

TABLE 7-continued

Complexity table for the example.

| | Complexity (cycles) |
| --- | --- |
| z, x, y order | 8560 |
| z, y, x order | 8464 |

Once an encoding order is determined, the parameters associated with encoding are permuted. Such parameters include constituent code parameters (e.g., SPC code, BCH code). Once the parameters are permuted, additional parameters related to the block product code may have to be determined. These additional parameters can be the number of codewords to produce in the first dimension, the number of codewords to produce in the second dimension, etc. Further, these additional parameters can be where to read (from memory) for encoding (e.g., "Starting address" column in Table 3), where to write (to memory), and a step size (e.g., "Memory Stride Size" column in Table 3). In many instances, the permuted parameters and additional parameters can be stored in a lookup table. In certain embodiments, the preferred decoding order and low complexity encoding order can be different. For example, the preferred decoding order can be x,z,y while the low complexity encoding order is y,x,z.

Thus, it is noted that in certain embodiments, block turbo decoder performance can be improved by combining one or more of the previously discussed performance enhancements, such as modifying encoded bit positions of the block product code, modifying decoded bit positions of a the block product code, permuting decoding parameters of the block product code to effect a preferred decoding order, detecting cases where a number of test patterns is insufficient to decode the soft-output information and thereafter providing a different number of test patterns suitable for decoding the soft-output information, and adapting the number of test patterns in the soft-input soft-output decoder. So, for example, if soft-input information corresponding to a first set of constituent codes of a block product code is received, then soft extrinsic information from a second set of constituent codes of the block product code can be scaled, and processing the scaled soft extrinsic information and the soft-input information to produce soft-output information suitable for a soft-input soft-output decoder can be performed in conjunction with the performance enhancements previously discussed.

Those skilled in the art will recognize upon consideration of the above disclosure, that certain embodiments can be implemented either using specialized hardware or can be realized using a programmed processor (dedicated or general purpose). General purpose computers, microprocessor based computers, micro-controllers, optical computers, analog computers, dedicated processors, Application Specific Integrated Circuits (ASICs) and/or dedicated hard wired logic may be used to construct equivalent embodiments of the present invention.

While certain illustrative embodiments have been described, it is evident that many alternatives, modifications, permutations and variations will become apparent to those skilled in the art in light of the foregoing description.

What is claimed is:

1. A method of adapting a number of test patterns in a soft-input soft-output decoder to generate a soft-output vector, comprising:

finding L+a least reliable positions within a soft-input vector;
constructing a set of test patterns where the set of test patterns is related to L least reliable positions;
for each test pattern vector Zi in the set of test patterns, performing a hard-decision decoding on a vector (Y+Zi) wherein Y is a binary vector constructed from the soft-input vector;
if the hard-decision decoder finds a valid codeword Ci associated with the vector (Y+Zi), saving the valid codeword Ci into a set S;
if the hard-decision decoder is unable to find a valid codeword, constructing an augmented test pattern Zi' using at least one of a least reliable positions, further comprising:
if hard-decision decoding the augmented binary vector (Y+Zi') finds a valid codeword Ci' associated with the binary vector (Y+Zi'), saving the valid codeword Ci' into the set S; and
generating the soft-output vector based on the set S.

2. The method of claim 1, wherein the soft-input soft-output decoder is a Chase decoder.

3. The method of claim 1, wherein the hard-decision decoder is a bounded distance decoder.

4. The method of claim 1, wherein employing the method is determined based upon one or more of:
a type of code the soft-input soft-output decoder is decoding;
an operating point of the soft-input soft-output decoder; and
the soft-input vector.

5. A method of improving soft-input soft-output decoder performance in a block turbo decoder, comprising:
detecting cases where a number of test patterns is insufficient to decode a soft-input vector corresponding to a constituent code of a block product code; and
providing a different number of test patterns to the soft-input soft-output decoder
wherein the number of test patterns is determined from one or more of:
a percentage of shortening for the constituent code;
an information from a previous decoding iteration;
an amount of shortening of the constituent codeword;
an iteration number of the block turbo decoder;
a constituent codeword length;
a type of constituent code; and
a number of test patterns required for a previous decoding iteration.

6. The method of claim 5, wherein the soft-input soft-output decoder is a Chase decoder.

7. The method of claim 5, wherein detecting cases where the number of test patterns is insufficient is performed before attempting to decode the soft-input vector.

8. The method of claim 5, wherein a different number of test patterns is used during each decoding iteration of the block turbo decoder.

9. The method of claim 8, wherein the number of test patterns is determined using a set of block product codes.

10. The method of claim 8, wherein one or more distinct numbers of test patterns are used for one or more corresponding constituent codes of a collection of block product codes.

11. The method of claim 5, wherein different constituent codes of the block product code have a different number of test patterns.

12. The method of claim 5, wherein the number of test patterns is a function of an iteration number of the block turbo decoder.

13. The method of claim 5, wherein the information from the previous decoding iteration further comprises:
comparing a number of bit positions in the soft-output vector that have inaccurate soft-output values from the previous decoding iteration to a threshold further comprising:
if this number of bit positions is greater than a first threshold, the number of test patterns is increased; and
if this number is less than a second threshold, the number of test patterns is reduced.

14. A method of decoding a block product code in a block turbo decoder, comprising:
receiving a soft channel vector;
determining alpha parameters based on two or more constituent codes;
partitioning the two or more constituent codes into a current constituent code and a previous set of constituent codes;
selecting an alpha vector for the current constituent code from the determined alpha parameters;
retrieving one or more extrinsic vectors for the previous set of constituent codes;
generating a soft-input vector for a soft-input soft-output decoder for the current constituent code wherein the soft-input vector is a sum of the soft channel vector and a dot product of the retrieved one or more extrinsic vectors and the selected alpha vector;
decoding the generated soft-input vector using the soft-input soft-output decoder for the current constituent code to produce an extrinsic vector for the current constituent code; and
storing the extrinsic vector for the current constituent code.

15. The method of claim 14, wherein the alpha parameters are predetermined by simulation.

16. The method of claim 14, wherein the alpha parameters are dynamically selected during one or more decoding iterations of the block turbo decoder.

17. The method of claim 14, wherein the block turbo decoder comprises a Chase decoder.

18. The method of claim 14, wherein the alpha parameters are selected so that a minimal block error rate for a range of signal-to-noise ratios (SNRs) is achieved.

19. The method of claim 14, wherein the alpha parameters are operable to be determined through the use of a contour map.

20. A method of improving block turbo decoder performance, comprising:
receiving soft-input information corresponding to a first set of constituent codes of a block product code;
scaling soft extrinsic information from a second set of constituent codes of the block product code;
processing the scaled soft extrinsic information and the soft-input information to produce soft-output information suitable for a soft-input soft-output decoder;
performing one or more of:
modifying encoded bit positions of the block product code;
modifying decoded bit positions of a the block product code;
permuting decoding parameters of the block product code to effect a preferred decoding order;
detecting cases where a number of test patterns is insufficient to decode the soft-output information and thereafter providing a different number of test patterns suitable for decoding the soft-output information; and adapting the number of test patterns in the soft-input soft-output decoder.

21. The method of claim 20, wherein permuting decoding parameters of the block product code to affect a preferred decoding order further comprises:

determining decoding parameters for a decoding order; and examining decoding parameters to determine the preferred decoding order.

* * * * *